United States Patent
Hosokawa et al.

[11] Patent Number: 6,157,127
[45] Date of Patent: Dec. 5, 2000

[54] ORGANIC ELECTROLUMINESCENT ELEMENT AND ORGANIC ELECTROLUMINESCENT DISPLAY

[75] Inventors: Chisio Hosokawa; Mitsuru Eida; Masahide Matsuura, all of Sodegaura, Japan

[73] Assignee: Idemitsu Kosan Co., Ltd., Tokyo, Japan

[21] Appl. No.: 09/147,010

[22] PCT Filed: Mar. 12, 1997

[86] PCT No.: PCT/JP97/00788

§ 371 Date: Sep. 11, 1998

§ 102(e) Date: Sep. 11, 1998

[87] PCT Pub. No.: WO97/34447

PCT Pub. Date: Sep. 18, 1997

[30] Foreign Application Priority Data

Mar. 12, 1996 [JP] Japan ........................................ 8-83349
Jan. 16, 1997 [JP] Japan ........................................ 9-5603

[51] Int. Cl.$^7$ ...................................................... H01J 1/62
[52] U.S. Cl. ............................................ 313/506; 313/509
[58] Field of Search .................................. 313/498, 504, 313/505, 506, 509, 512

[56] References Cited

U.S. PATENT DOCUMENTS 5,216,331  6/1993  Hosokawa et al. .

FOREIGN PATENT DOCUMENTS

WO 97/46054  4/1997  WIPO .

*Primary Examiner*—Vip Patel
*Attorney, Agent, or Firm*—Oblon, Spivak, McClelland, Maier & Neustadt, P.C.

[57] ABSTRACT

Disclosed is an organic electroluminescence element comprising a substrate, and a lower electrode 2, an organic layer 3 and a counter electrode 4 superposed on the substrate in the mentioned order, the lower electrode having a specific resistance which is equal to or more than $0.5 \times 10^{-4}$ Ω·cm, the lower electrode 2 being connected to a wiring layer 5, the wiring layer 5 being implanted in a planarization layer 6 interposed between the substrate 1 and the lower electrode 2 or in the substrate 1.

20 Claims, 24 Drawing Sheets

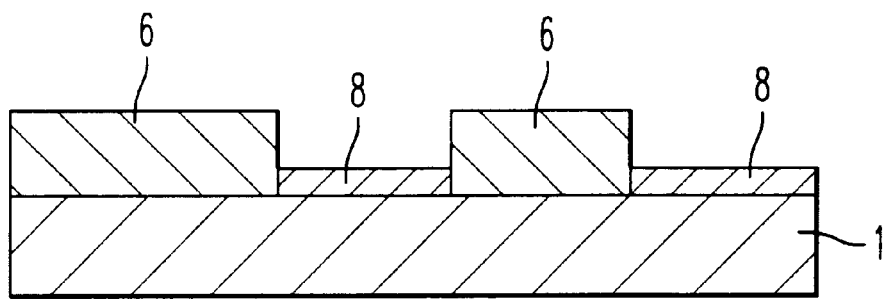
FIG. 5a
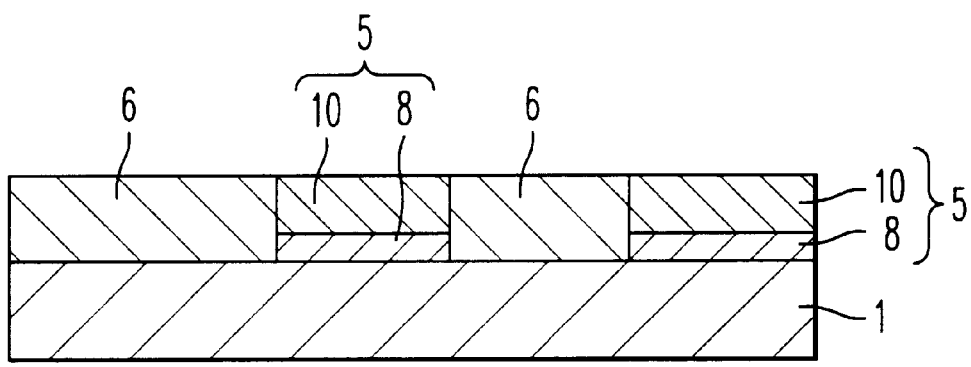
FIG. 5b

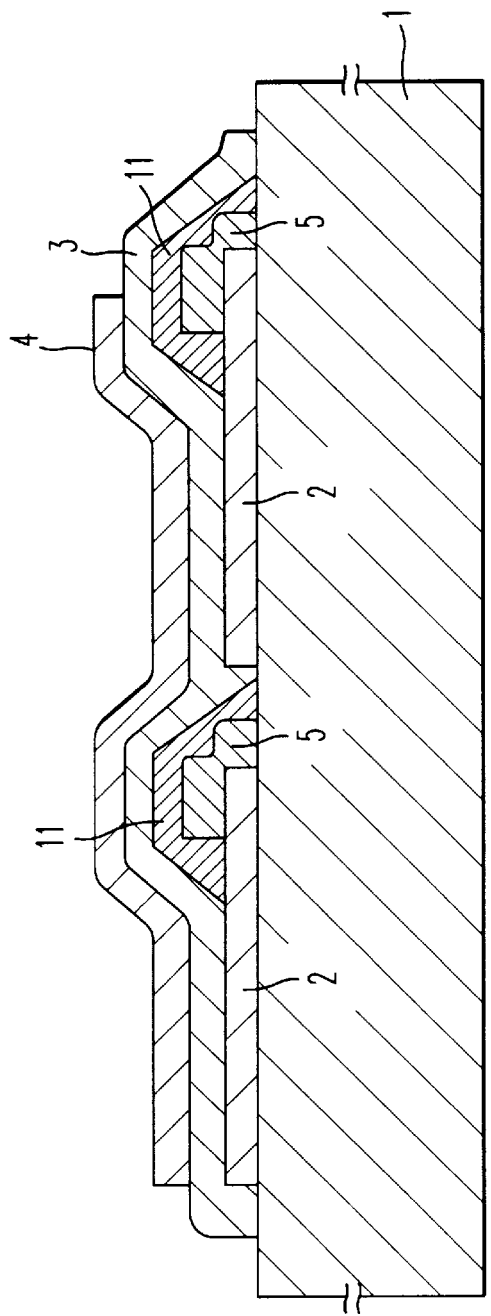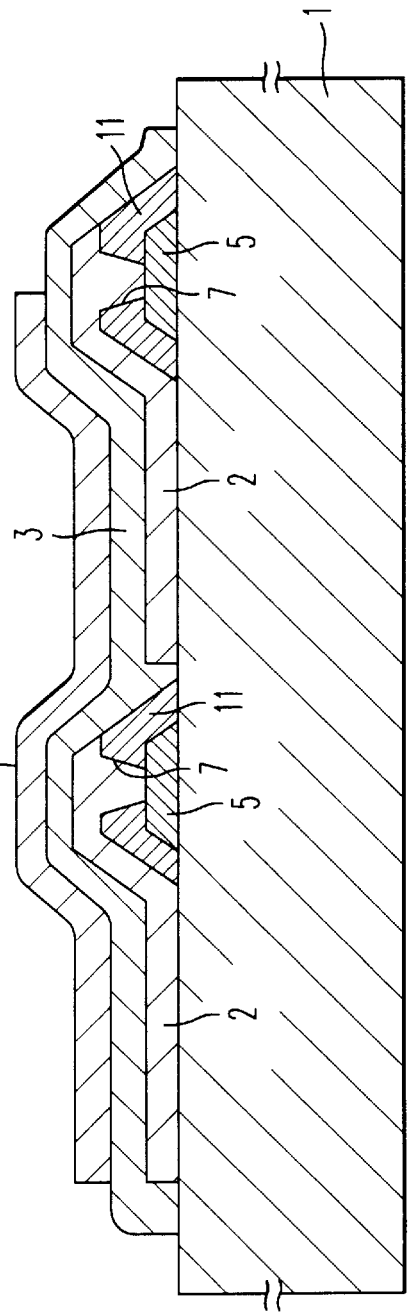

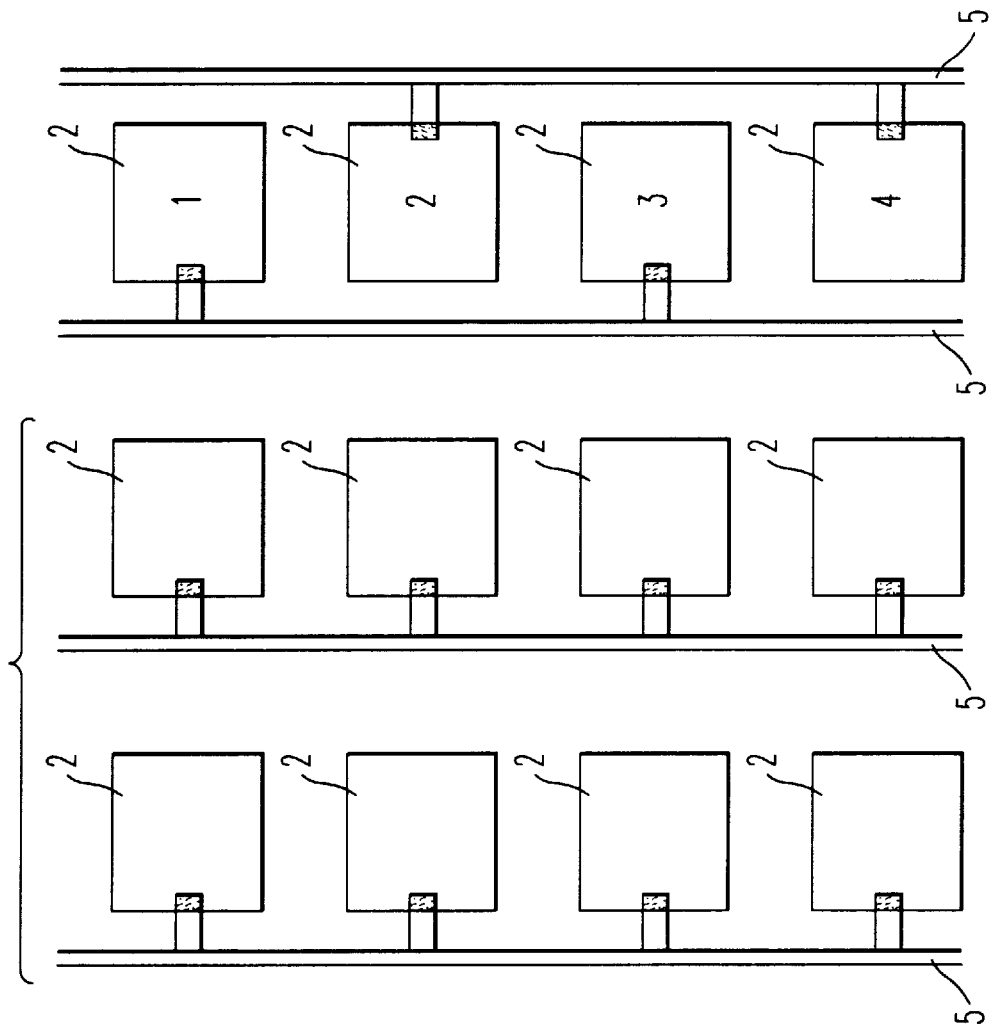
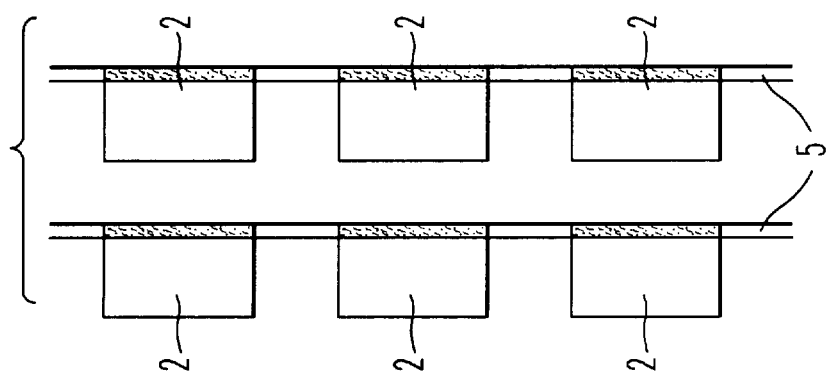

ORGANIC ELECTROLUMINESCENT ELEMENT AND ORGANIC ELECTROLUMINESCENT DISPLAY

TECHNICAL FIELD

The present invention relates generally to an organic electroluminescence element (hereinafter, may be abbreviated as organic EL element) and an organic EL display device. More particularly, the invention relates to an organic EL element and an organic EL display device suitable for use mainly in various displays for information industry equipment, free from any delay in response upon the drive which may be caused by the voltage drop attributable to wirings or by the resistance of electrodes.

BACKGROUND ART

An organic EL element consists basically of a lower electrode, an organic luminescent layer and a counter electrode. Then, the lower electrodes and the counter electrodes are matrixed so that pixels are formed at their intersections, with the result that a display can be formed by a plurality of arrays of pixels.

By the way, recent display devices utilizing the organic EL elements have a tendency toward high definition and large size. Thus, in order to realize the high definition, it is desired that the pixel size should be equal to or less than several hundreds of micron square.

In this case, scanning electrode lines and signal electrode lines constituting a display become finer, and accordingly the resistance may possibly go up to several KΩ or more. The high definition display has more than 100 scanning electrode lines and more than 100 signal electrode lines. In this case, the duty must be achieved with a pulse number which is equal to the reciprocal of the number of scanning electrode lines, so that a high current pulse flows across the scanning electrode lines. At that time, there arose a problem that a high resistance of the scanning electrode lines or signal electrode lines might cause a voltage drop attributable to the wiring or a delay in response upon the drive attributable to the electrode resistance. That is, the voltage drop resulted in uneven luminance of the display, whereas the delay in response upon the drive resulted in a restriction of display since the delay may make it difficult to provide a fast moving picture in case of the fabrication of a high definition display.

To overcome such problems, the following organic EL elements are for example proposed.

Japanese Patent Laid-open Pub. No. Hei4-82197 discloses an organic EL element having a transparent electrode connected to a metal line to reduce the resistance of the transparent electrode.

Japanese Patent Laid-open Pub. No. Hei5-307997 discloses an organic EL element also having a transparent electrode on which is disposed a metal with a small work function to reduce the resistance of the transparent electrode.

Japanese Patent Pub. No. Hei5-76155 discloses an example of use of an auxiliary metal film in the EL element. An insulating film is disposed especially on the auxiliary metal film to prevent a dielectric breakdown.

However, the organic EL elements disclosed in Japanese Patent Laid-open Pub. Nos. Hei4-82197 and Hei5-307997 suffered from a problem that steps formed by the auxiliary metal wire might often break the counter electrode to cause any display defect. Furthermore, because of the injection of infinitesimal electric charges from the metal wiring into the organic layer of the organic EL element, e.g., a hole injection layer, the so-called cross talk often occurred.

An inorganic EL element disclosed in Japanese Patent Pub. No. Hei5-76155 also entailed a problem that some steps were caused by the thickness of the auxiliary metal film and the insulating film, resulting in frequent occurrence of breakage in the counter electrode.

The present invention was conceived in view of the above problems. It is therefore the object of the present invention to provide an organic EL element capable of reducing the resistance value of the transparent electrode (lower electrode) and eliminating steps attributable to the wiring layer to prevent a possible breakage in the counter electrode as well as capable of preventing the occurrence of the cross talk.

It is another object of the present invention to provide, for use as a high definition and large size display device, an organic EL display device using the organic EL element having the above characteristics, capable of significantly reducing the resistance value of the scanning electrode lines to achieve a uniform luminescence.

DISCLOSURE OF THE INVENTION

As a result of wholehearted research to solve the above problems, the inventors found out that the above problems could be solved by introducing specific configurations into the organic EL element. The present invention was completed on the basis of such viewpoint.

The gists of the present invention are as follows.

[1] An organic electroluminescence element comprising a substrate and thereon superposed in the mentioned order a lower electrode, an organic layer including an organic luminescent layer, and an counter electrode; the lower electrode having a specific resistance which is equal to or more than $0.5 \times 10^{-4}$ Ω·cm, the lower electrode connecting to a wiring layer for reducing the resistance value, the wiring layer being implanted in a planarization layer interposed between the substrate and the lower electrode.

[2] The organic electroluminescence element according to [1], wherein the wiring layer is implanted in the planarization layer interposed between the substrate and the lower electrode and is covered with the lower electrode.

[3] An organic electroluminescence element comprising a substrate and thereon superposed in the mentioned order a lower electrode, an organic layer including an organic luminescent layer, and a counter electrode; the lower electrode having a specific resistance which is equal to or more than $0.5 \times 10^{-4}$ Ω·cm, the lower electrode connecting to a wiring layer for reducing the resistance value, the wiring layer being covered with a flattened interlayer insulating film interposed between the wiring layer and the organic layer including an organic luminescent layer.

[4] The organic electroluminescence element according to any one of [1] to [3], wherein the lower electrode is a transparent electrode.

[5] The organic electroluminescence element according to any one of [1] to [3], wherein the planarization layer or the interlayer insulating film is an oxide film obtained by oxidizing the surface of a metal film forming the wiring layer.

[6] The organic electroluminescence element according to [3], wherein the interlayer insulating film has a trapezoidal (tapered) section.

[7] The organic electroluminescence element according to any one of [1] to [3], wherein the lower electrode and the counter electrode form an XY matrix.

[8] The organic electroluminescence element according to any one of [1] to [3], wherein the wiring layer reduces the resistance value of an electrode line to 5 kΩ or below.

[9] The organic electroluminescence element according to [7], wherein the XY matrix formed from the lower electrode and the counter electrode is a double, triple or quadruple matrix.

[10] An organic electroluminescence element comprising a substrate and thereon superposed in the mentioned order a lower electrode, an organic layer including an organic luminescent layer, and a counter electrode; the lower electrode being connected to a wiring layer, the wiring layer having a width which is equal to 20 to 150% of the width (the length of short side) of the lower electrode, the wiring layer being implanted in a planarization layer interposed between the substrate and the lower electrode.

[11] The organic electroluminescence element according to [10], wherein the lower electrode and the counter electrode form an XY matrix.

[12] The organic electroluminescence element according to [10] or [11], wherein the wiring layer has a resistance value for unit length (1 cm) which is equal to or less than 100 Ω.

[13] An organic electroluminescence display device comprising a plurality of scanning electrode lines and a plurality of signal electrode lines intersecting the plurality of scanning electrode lines, with their intersections being provided with luminous pixels in arrays; the luminous pixels being organic electroluminescence elements each comprising a substrate and thereon superposed in the mentioned order a lower electrode, an organic layer including an organic luminescent layer, and a counter electrode, the scanning electrode lines each comprising the lower electrode and a wiring layer connected thereto, the wiring layer being implanted in a planarization layer interposed between the substrate and the lower electrode, the signal electrode lines each including the counter electrode.

[14] An organic electroluminescence display device according to [13], wherein the wiring layer has a width (length of the short side) which is equal to 20 to 150% of the width (length of the short side) of the lower electrode.

[15] The organic electroluminescence display device according to [13] or [14], wherein the wiring layer has a resistance value for unit length (1 cm) which is equal to or less than 100 Ω.

[16] An organic electroluminescence element comprising a substrate and thereon superposed in the mentioned order a lower electrode, an organic layer including an organic luminescent layer, and a counter layer; the element comprising a wiring layer connected to the bottom of the lower electrode, with a layer formed from a lateral layer covering the side of the wiring layer and from the wiring layer being trapezoidal (tapered) in section, the wiring layer being isolated by the lower electrode and the lateral layer from the organic layer.

[17] The organic electroluminescence element according to [16], wherein the lower electrode and the counter electrode form an XY matrix.

[18] The organic electroluminescence element according to [16] or [17], wherein the lateral layer is made of a material selected from a group consisting of the same material as that of the lower electrode layer, an insulating material, and a material allowing the amount of the injection of electric charges into the organic layer which is equal to or less than 1/50 of that of the lower electrode.

[19] An organic electroluminescence display device comprising a plurality of scanning electrode lines and a plurality of signal electrode lines intersecting the plurality of scanning electrode lines, with their intersections being provided with luminous pixels in arrays; the luminous pixels being organic electroluminescence elements each comprising a substrate and thereon superposed in the mentioned order a lower electrode, an organic layer including an organic luminescent layer, and a counter electrode, the scanning electrode lines each comprising the lower electrode and a wiring layer connected to the bottom of the lower electrode, with a layer formed from a lateral layer covering the side of the wiring layer and from the wiring layer being trapezoidal (tapered) in section, the wiring layer being isolated from the organic layer by the lower electrode and the lateral layer covering the side of the wiring layer, the signal electrode lines each including the counter electrode.

[20] The organic electroluminescence display device according to [19], wherein the lateral layer is made of a material selected from a group consisting of the same material as that of the lower electrode layer, an insulating material, and a material allowing the amount of the injection of electric charges into the organic layer which is equal to or less than 1/50 of that of the lower electrode.

Thus, according to the present inventions as set forth hereinabove, it is possible to provide an organic electroluminescence element capable of reducing the resistance of the lower electrode and preventing a breakage in the counter electrode as well as an occurrence of the so-called cross talk.

Furthermore, according to the present invention, it is possible to provide an organic EL display device capable of extremely reducing the resistance value of the scanning electrode lines to achieve a uniform electroluminescence, for use as a high definition and large size display device.

BRIEF DESCRIPTION OF THE DRAWINGS

FIGS. 5a–5b are a schematic sectional view diagrammatically showing a further example of the method for forming the wiring layer and the planarization layer in the first invention;

FIGS. 8a–8b are a schematic sectional view diagrammatically showing an embodiment of an organic electroluminescence element in accordance with a second invention;

FIGS. 13a–13c are a schematic sectional view diagrammatically showing an example of a pattern of the wiring layer and a lower electrode in the present invention;

FIGS. 24a–24e are a schematic sectional view diagrammatically showing yet another example of the method for forming the lower electrode, wiring layer and planarization layer in the third invention;

BEST MODE FOR CARRYING OUT THE INVENTION

Embodiments of the present invention will now be described specifically with reference to the drawings.

The present invention is classified into a first invention to a sixth invention on the basis of their respective aspects.

I. First Invention

Figure 1:
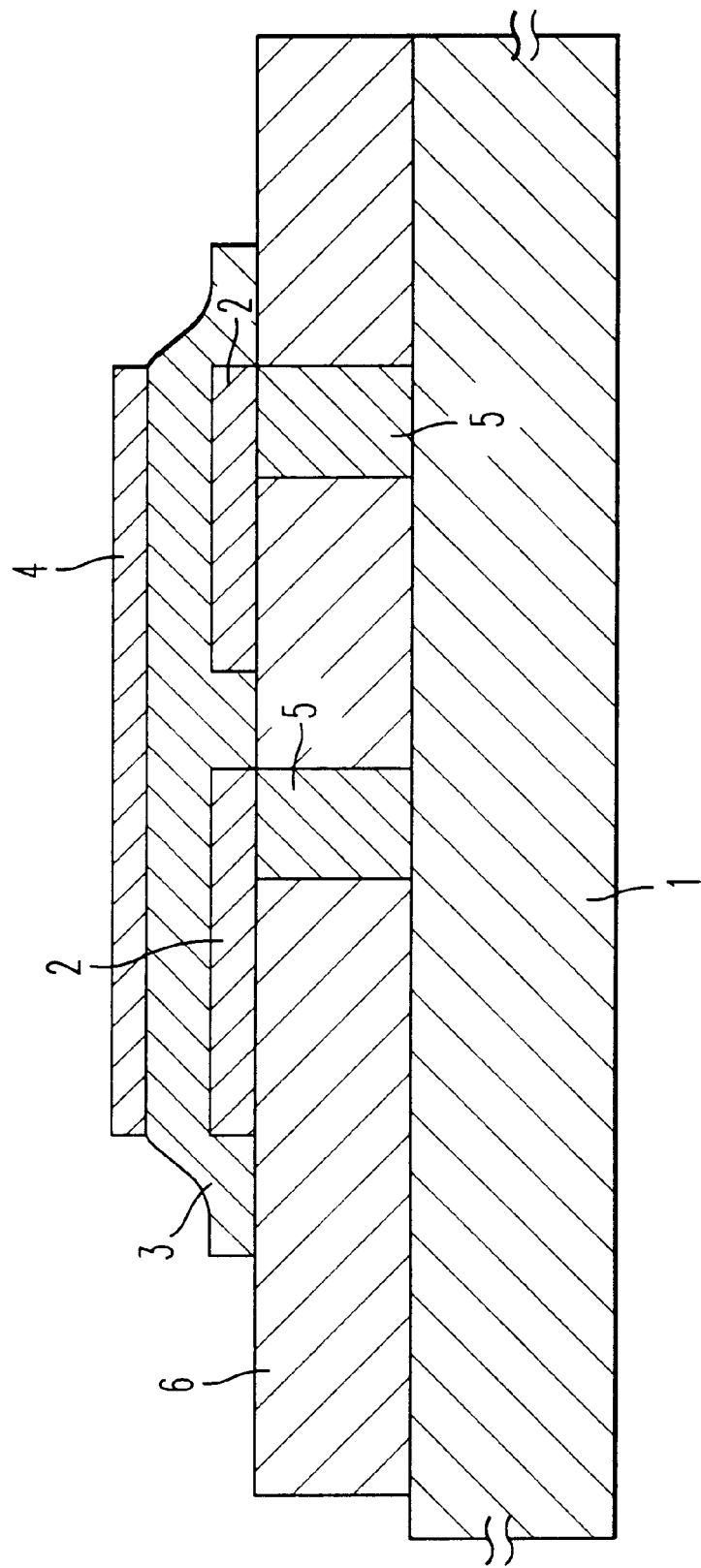
FIG. 1 is a schematic sectional view diagrammatically showing an embodiment of an organic electroluminescence element in accordance with a first invention.
Figure 2:
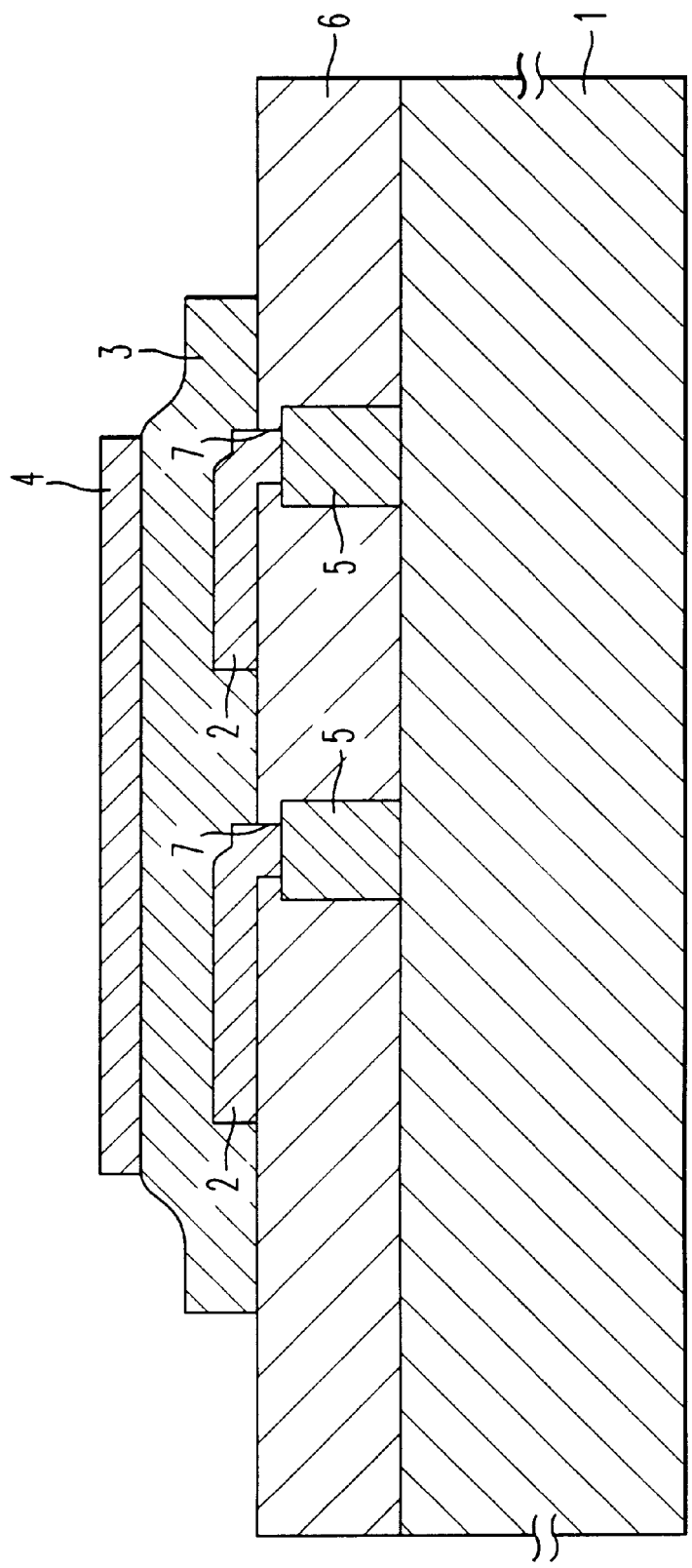
FIG. 2 is a schematic sectional view diagrammatically showing another embodiment of the organic electroluminescence element in accordance with the first invention.

1. Basic Mode (Organic EL Element Having Planarization layer: Part 1) The first invention relates to an organic electroluminescence element comprising as shown in FIG. 1 or 2 a substrate 1 and thereon superposed in the mentioned order a transparent electrode (lower electrode) 2, an organic layer 3 including an organic luminescent layer (hereinafter, sometimes abbreviated as an organic layer), and a counter electrode(opposed electrode)4. The lower electrode 2 has a specific resistance which is equal to or more than $0.5 \times 10^{-4}$ $\Omega \cdot cm$. A wiring layer 5 for reducing the resistance value of the lower electrode 2 is implanted in a planarization layer 6 interposed between the substate 1 and the lower electrode 2.

Accordingly, the wiring layer 5 is not allowed to protrude upward from the lower electrode 2, so that there occur no steps attributable to the wiring layer 5, providing an effective prevention against a breakage of the counter electrode 4.

The wiring layer 5 is electrically connected to the lower electrode 2, although in the present invention the lower electrode 2 is disposed on top of the wiring layer 5 so as to cover the latter, so that there is no occurrence of a leak current arising from a migration of electric charges from this wiring layer 5 into the organic layer 3, providing an effective prevention against a cross talk.

Another embodiment of the first invention can be configured in a manner illustrated in FIG. 2 for example.

In this embodiment, as shown in FIG. 2, the wiring layer 5 is covered with the planarization layer 6 in such a manner that an electric connection between the wiring layer 5 and the lower electrode 2 is achieved through a contact hole 7 formed in the planarization layer 6. This embodiment also inhibits the wiring layer 5 from protruding upward from the lower electrode 2, providing an effective prevention against a breakage of the counter electrode 4 and against a cross talk.

2. Constituent Elements

The first invention will hereinafter be described more specifically on a constituent element basis.

(1) Lower Electrode

In the present invention, the lower electrode is electrically connected to the wiring layer. Then the wiring layer is made of a material having a higher electrical conductivity, so that it is not essential to use such a material having a higher electrical conductivity to make up the lower electrode.

The lower electrode layer can be either an anode or a cathode. In the case of the anode, use can be made of an electrically conductive material such as a metal having a high work function (a work function which is equal to or more than 4.5 eV) excellent in hole injection properties. A semiconductor is also available as the anode since the latter can have any specific resistance. More specifically, it is preferable to use for example metals such as gold (Au), nickel (Ni), palladium (Pd) and platinum (Pt), electrically conductive oxides such as In—Sn—O, ZnO: Al (a mixture of ZnO and Al added thereto) and In—Zn—O, $SnO_2$: Sb (a mixture of $SnO_2$ and Sb added thereto), and semiconductors such as α-silicon, polysilicon, α-silicon carbide and α-carbon. An organic semiconductor in the form of a full conjugated type polymer is also available. More specifically, it is preferable to use such polymers as polyaniline, polyallylenevinylene, polythienylenevinylene polyacetylene, polypyrrole, etc.

In the case of the cathode, on the other hand, use can be made of an electrically conductive material such as a metal or an alloy having a low work function (a work function which is equal to or less than 3.9 eV) excellent in electron injection properties. A semiconductor is also available as the cathode since the latter can also have any specific resistance. A preferred alloy for use can be one containing a minute amount of alkaline earth metal, alkaline metal or a rare earth metal, for example, Al—Li, Al—Mg, Al—Ba, Al—Ca, Al—Sc, Al—Yb, etc. It is also possible to use as the cathode an ultrathin film (of the order of 20 nm or less) made of alkaline earth metal oxides such as BaO, SrO, MgO, etc.

Figure 16:
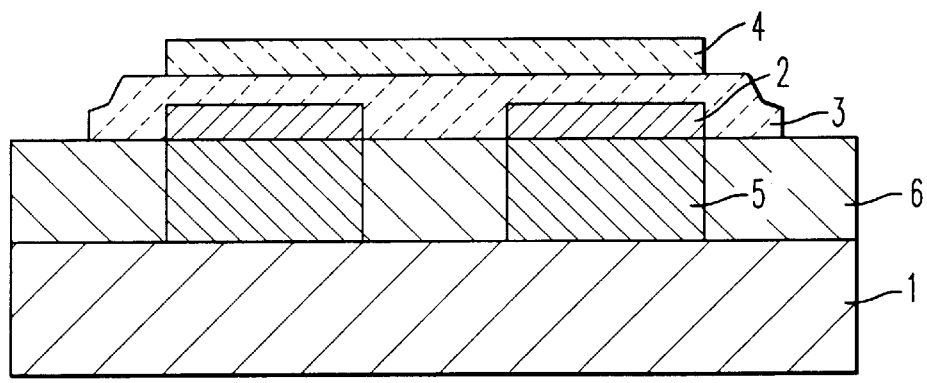
FIG. 16 is a schematic sectional view diagrammatically showing an embodiment of an organic electroluminescence element in accordance with a third invention.

Since the lower electrode layer may have a high surface resistance value in the present invention, the thickness can be reduced. It is preferred in this case that the thickness should be equal to or less than 200 nm and in particular 2 to 100 nm. In such a case, a continuous layer may not be formed when the thickness is within a range 2 to 10 nm. As long as the lower electrode layer is in familiar contact with the wiring layer as shown in FIG. 16, however, there arises no inconvenience to the operation of the element. On the contrary, a thickness larger than 200 nm may result in a breakage of the organic layer and the counter electrode in the stepped regions of the lower electrode layer.

It is to be appreciated in the present invention that the lower electrode can be formed by use of known methods. The lower electrode may be provided for example by forming a film with sputtering and thereafter by patterning it with photolithography.

(2) Wiring Layer

The wiring layer in the present invention functions as an auxiliary electric wire for reducing the resistance value of the lower electrode. It is therefore necessary for the wiring layer to have a low resistance value and to be electrically connected to the lower electrode. As used herein, "electrically" means that when a power source is connected to the wiring layer and the counter electrode, the wiring layer and the lower electrode are connected with each other so as to allow a voltage to be applied to the organic EL element. It is therefore preferred that the wiring layer have a low surface resistance value since a current supplied to the organic EL element flows therethrough. The provision of such a wiring layer enables the resistance value of the lower electrode layer to be extremely reduced.

The wiring layer for use in the present invention is not limited to a particular one as long as it has a low resistance value. It is preferable for example to use a metal wire allowing the resistance value of an electrode line (e.g., a signal electrode line) reduced by this wiring layer to be equal to or less than 5 k$\Omega$). The resistance value exceeding 5 k$\Omega$ may possibly cause the inuniformity in the luminance of pixels. In the case of performing a TV image display, it is more preferred that the resistance value should be equal to or less than 1 k$\Omega$.

In case the length of the signal electrode line is of the order of 10 cm, it is preferred that 100 $\Omega$ or below for unit length (per cm) would be ensured.

The wiring layer has preferably a specific resistance which is equal to or less than $5\times10^{-5}$ $\Omega\cdot$cm. The specific resistance exceeding $5\times10^{-5}$ $\Omega\cdot$cm may not give birth to the effect of reduction in the resistance value by the provision of the wiring layer.

Metals for use in such a wiring layer can be for example a tungsten (W), aluminum (Al), copper (Cu), silver (Ag), molybdenum (Mo), tantalum (Ta), gold (Au) chromium (Cr), titanium (Ti), neodymium (Nd) and alloys of these metals. The specific examples of these alloys include Mo—W, Ta—W, Ta—Mo, Al—Ta, Al—Ti, Al—Nd and Al—Zr. It is also preferable to use compounds of a metal and silicon such as $TiSi_2$, $ZrSi_2$, $HfSi_2$, $VSi_2$, $NbSi_2$, $TaSi_2$, $CrSi_2$, $WSi_2$, $CoSi_2$, $NiSi_2$, $PtSi_2$ and $Pd_2Si$. A layered structure of these metals or silicon compounds may also be employed.

Table 1 shows the specific resistance of metals suitable for use as the wiring layer used in the present invention.

TABLE 1

| METAL | SPECIFIC RESISTANCE ($\mu\Omega\cdot$cm) |
|---|---|
| Al | 3 |
| Cr | 25 |
| Ta | 180 |
| Ta: Mo | 40 |
| Ti | 84 |
| Mo: W | 15 |
| No | 53 |
| Al: Ti | 10 to 30 |
| Al: Ta | 10 to 30 |
| Al: Nd | 6 to 14 |

It is preferred in view of the easiness of formation that the wiring layer should be formed in the state of a metal film as described hereinafter. In this case, it may be more preferred in order to enhance the film stability that the metal film comprise a multilayered film consisting of two or more layers. This multilayered film can be formed by use of the above metals or alloys thereof. For example, a three-layered film may consist of a Ta layer, a Cu layer and a Ta layer, or a Ta layer, an Al layer and a Ta layer. A two-layered film may consist of an Al layer and a Ta layer, a Cr layer and an Au layer, or an Al layer and a Mo layer.

As used herein, the film stability means that a low specific resistance can be kept and that the film has a resistance to corrosion caused by e.g., a liquid used for etching. For example, Cu or Ag layer has a low specific resistance by itself but is apt to corrode, although the stability of that film can be enhanced by superposing a layer made of a metal excellent in the anticorrosive properties such as Ta, Cr or Mo for example on at least one of the top and bottom thereof.

The thickness of such a metal film is not particularly limited but is preferably 100 nm to several tens of microns, more preferably 200 nm to 5 $\mu$m. The thickness less than 100 nm may result in a larger resistance value, which is unsuitable for the wiring layer, whereas the thickness exceeding several tens of microns may result in a difficulty in the planarization, which may degrade the performance of the organic layer formed on top of the same. The width (length of the short side) of the metal film is particularly limited either, although 2 $\mu$m to 1000 $\mu$m is preferred and 50 $\mu$m to 300 $\mu$m is particularly preferred. The width less than 2 $\mu$m may result in a larger resistance value of the wiring layer, whereas the width exceeding 100 $\mu$m may interfere with the emission of the luminescence.

(3) Planarization layer

The planarization layer is a layer made of an insulating layer provided for reducing the patterned protrusions in the wiring layer. A preferred degree of flatness is 0.2 $\mu$m or less. A surface roughness is preferably equal to or less than 10 nm to suppress a generation of a luminous defect. As used herein, the degree of the planarization is the amount of the roughness in the wiring layer, which can be measured by a profilometer, a thickness tester, a scanning interatomic force microscope or the like. The surface roughness on the other hand is a surface roughness of the planarization layer itself and is a mean square value of the surface roughness which can be measured by 500 $\mu$m square to 1 mm square.

The material of the planarization layer for use in the present invention is not particularly limited as long as it has insulation properties but preferably has a breakdown voltage which is equal to or more than 2 MV/cm. It is also preferred that it have a heat resistance enough to withstand the temperature upon the formation of the lower electrode. The material can be for example a transparent polymer, an oxide or a glass. It is preferred that it be a material allowing etching since a fine patterning for e.g., the formation of apertures is required upon the implantation of the wiring layer or upon the formation of a contact hole for electrically connecting the wiring layer and the lower electrode.

More specifically, preferred examples of the transparent polymer include polyimide, fluorinated polyimide, fluorine based resin, polyacrylate, polyquinoline, polyoxadiazole, polyolefin having a cyclic structure, polyarylate, polycarbonate, polysulfone and ladder polysiloxane. Preferred examples of the oxide as the material allowing etching include $SiO_2$, $Al_2O_3$, $Ta_2O_3$, $Si_3N_4$, fluorine added $SiO_2$, MgO, $Yb_2O_3$. More preferred among the above materials are polyimide, polyacrylate, glass, etc., which possess a photosensitivity and enable etching to be performed without using a photoresist.

The thickness of this layer is not particularly limited as long as it allows implantation of the wiring layer, but preferably it is more than the thickness of the wiring layer and not more than 10 μm.

(4) Other Constituent Elements

The organic EL element comprises as its constituent elements, in addition to the lower electrode, wiring layer and planarization layer, the organic layer including the organic luminescent layer, the counter electrode and the substrate.

In the organic EL element of the present invention, the organic layer interposed between the lower electrode and the counter electrode includes at least the organic luminescent layer. The organic layer may be a single layer consisting of only the organic luminescent layer or alternatively it may have a multilayered structure consisting of the organic luminescent layer and a hole transport layer, etc., superposed thereon. The type of the luminescent material for use as the organic luminescent layer is not particularly limited and known ones in the conventional organic EL element are available. For example, the material of the organic luminescent layer can be a layer providing the organic EL element in high level with an oxine metal complex, a stilbene based dye, and a polyphenylenevinylene derivative.

The counter electrode is an electrode paired with the lower electrode and has electric charges with a polarity opposite to that of the lower electrode. Then electric charges (holes or electrons) injected from the lower electrode side collide in the organic luminescent layer with electric charges (electrons or holes) injected from the counter electrode side, to generate a luminescence. The thus generated luminescence is emitted from the lower electrode side and/or the counter electrode side, although in the present invention the emission is made from the electrode side in case the width of the wiring layer is within the range of 100 to 150%. In this case, there is a need to employ a counter electrode ensuring a transmittance which is equal to or more than 30% in the luminous wavelength. Such a material can be one in common use for this type of organic electroluminescence element. For example, it can be a transparent electrically conductive oxide film, an ultrathin metal or alloy film having a thickness which is equal to or less than 20 nm, or a laminated film consisting of the transparent electrically conductive oxide film and the ultrathin film.

A material of the substrate can be one in common use for such a type of organic electroluminescence element as long as it is excellent in mechanical strength and has a low permeability to water or oxygen. More specifically, it can be for example a glass or ceramics.

3. Method for Forming Wiring Layer and Planarization layer

A method for forming the wiring layer and the planarization layer is not particularly limited but preferred examples of the method are as follows.

Figure 3A:
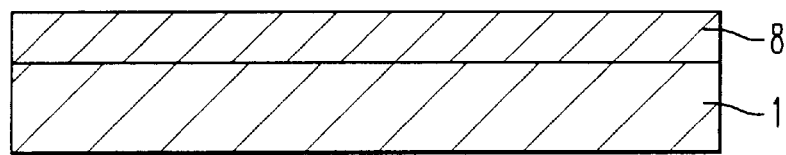
FIGS. 3a–3d are a schematic sectional view diagrammatically showing an example of a method for forming a wiring layer and a planarization layer in the first invention.

(1) Anodizing Method This method is a process in which a material making up the wiring layer is used to form a metal film on the substrate. As shown in FIG. 3(a), a metal film 8 is formed on the substate 1 until it has a predetermined thickness for the wiring layer by use of a known film deposition method such as the vapor deposition method, the sputtering method or the CVD method.

Figure 3B:
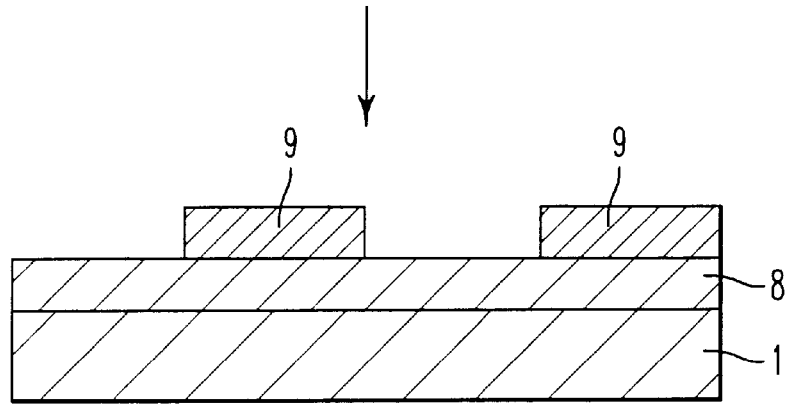

Then as shown in FIG. 3(b), a photoresist is coated on the metal film 8 and exposed to light so that the photoresist 9 is positioned at patterned regions forming a wiring layer therein.

Figure 3C:
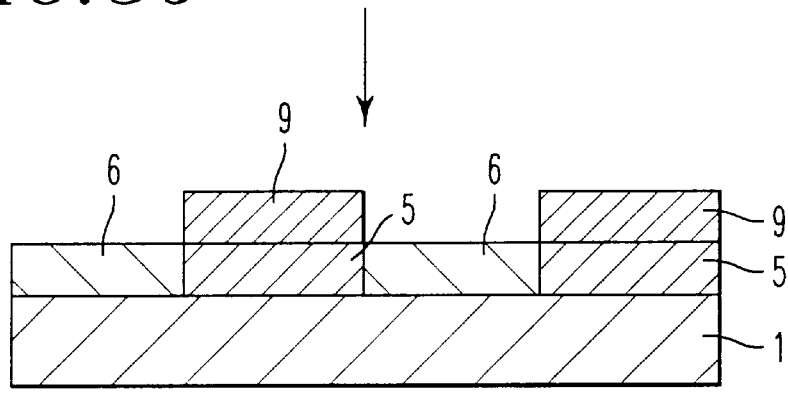

Then as shown in FIG. 3(c), anodizing is used to entirely oxidize the metal film 8 at aperture regions where no photoresist 9 exists. The thus oxidized metal film 8 serves as a planarization layer 6.

Figure 3D:
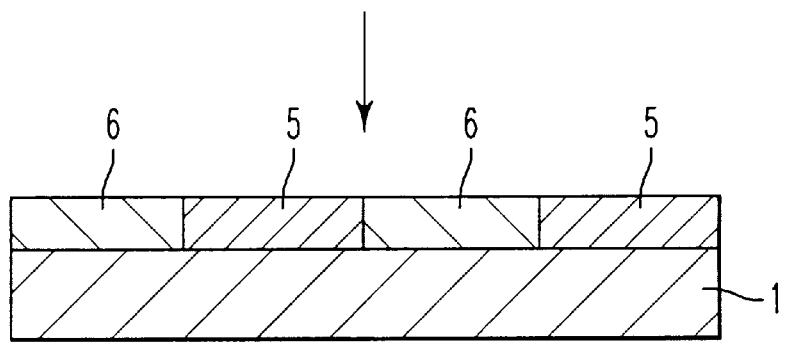

Finally, as shown in FIG. 3(d), the photoresist 9 is removed to form a wiring layer 5 implanted in the planarization layer 6.

It is to be appreciated that it would be impossible to employ this method if no use is made of a material such as Al, Cr or Ta allowing the anodization.

(2) Lift-off Method

This method is a process in which a metal film is formed after the formation of a planarization layer on the substrate. In case of using a transparent polymer as the material of the planarization layer, the film deposition method can be the spin coating, the coating method, the immersion coating or other methods. In case of using oxides, glass or the like, the film deposition method can be the vapor deposition, the sputtering method, the CVD method, the anodizing method or other methods.

Figure 4A:
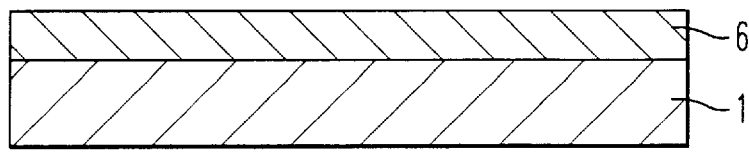
FIGS. 4a–4e are a schematic sectional view diagrammatically showing another example of the method for forming the wiring layer and the planarization layer in the first invention.

As shown in FIG. 4(a), a planarization layer 6 is first formed on a substate 1.

Figure 4B:
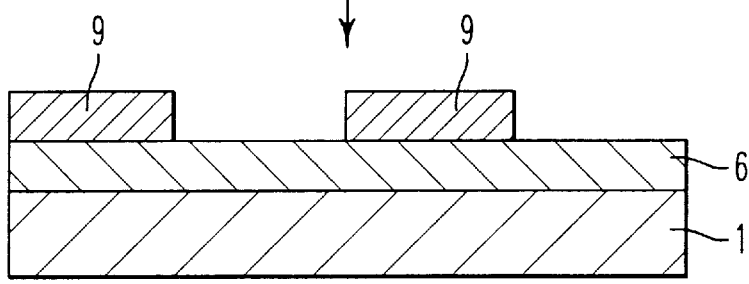

Then as shown in FIG. 4(b), a photoresist is coated on the planarization layer 6 and is exposed to light so that a photoresist 9 is positioned at patterned regions forming no wiring layer.

Figure 4C:
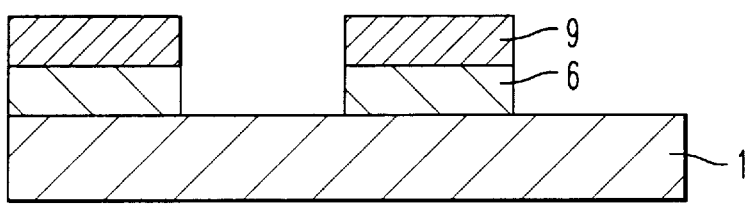

Then as shown in FIG. 4(c), the photoresist 9 is used as a mask to etch the planarization layer 6 for removal.

Figure 4D:
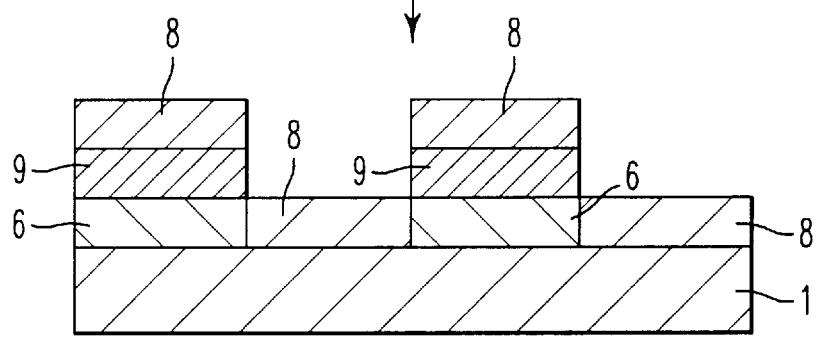

Then as shown in FIG. 4(d), a metal film 8 is formed.

Figure 4E:
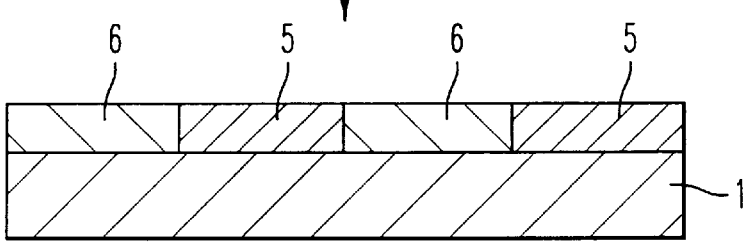

Furthermore, as shown in FIG. 4(e), the photoresist 9 together with the metal film 8 thereon is removed to form a wiring layer 5 implanted in the planarization layer 6.

In case the desired thickness of the wiring layer 5 is as large as one to several tens of microns, metal plating method may be used in place of the vapor deposition method, the sputtering method or the CVD method requiring too much time to form the film.

For example, as shown in FIG. 5(a), a thin metal film 8 is formed on a substate 1 by use of this lift-off method. Then as shown in FIG. 5(b), a metal deposit 10 is formed on top of the metal film 8 by use of non-electrolytic or electrolytic plating method, thereby increasing the thickness to form a wiring layer 5 consisting of the deposit 10 and the metal film 8.

(3) Polymer Planarization Method

This method is a process in which contact holes are provided by covering a wiring layer pattern with a planarization layer.

Figure 6A:
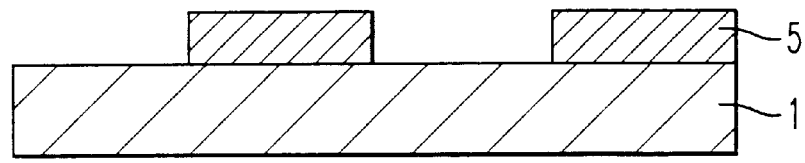
FIGS. 6a–7d are a schematic sectional view diagrammatically showing still another example of the method for forming the wiring layer and the planarization layer in the first invention.

As shown in FIG. 6(a), a wiring layer pattern 5 is formed on a substate 1 by use of photoetching, lift-off or other methods.

Figure 6B:
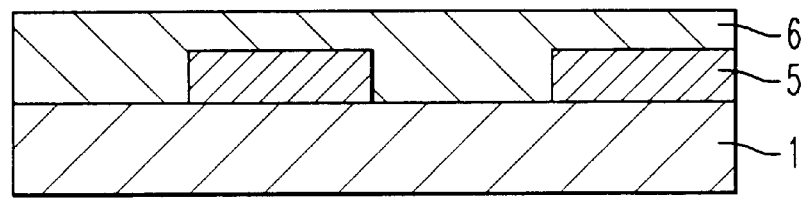

Then as shown in FIG. 6(b), a planarization layer 6 is formed so as to cover the wiring layer pattern 5. The formation method can be the spin coating method, the coating method, the vapor deposition method, the CVD method, the sputtering method or other methods.

In case a polymer used herein has a photosensitivity, formation of the contact hole regions can simultaneously be carried out.

Figure 6C:
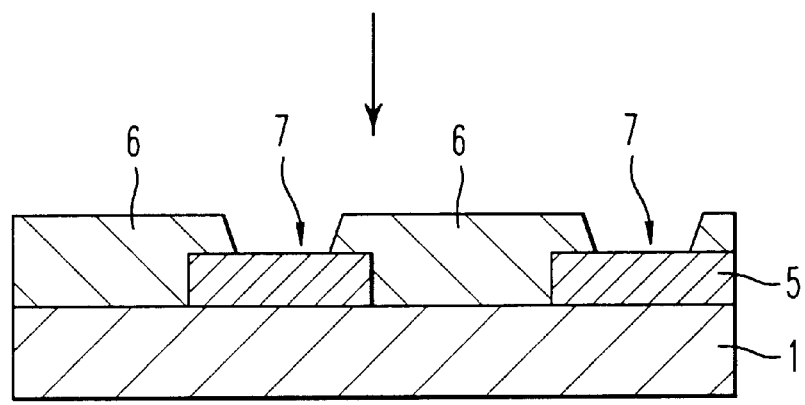

Then as shown in FIG. 6(c), contact holes 7 are provided in the planarization layer 6 by etching using the photoresist. In order to prevent a layer formed thereon from breaking, the contact holes 7 are preferably downwardly tapered. By connecting the lower electrode to the auxiliary electrode 5 by way of these contact holes, it is possible to make the organic electroluminescence element as shown in FIG. 2.

Figure 6D:
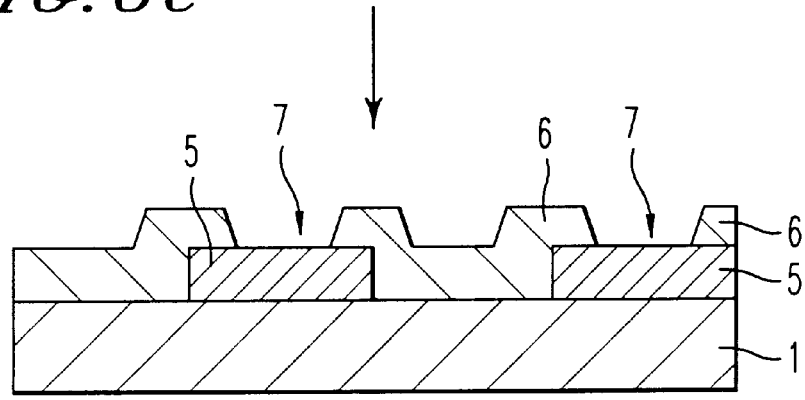
Figure 7A:
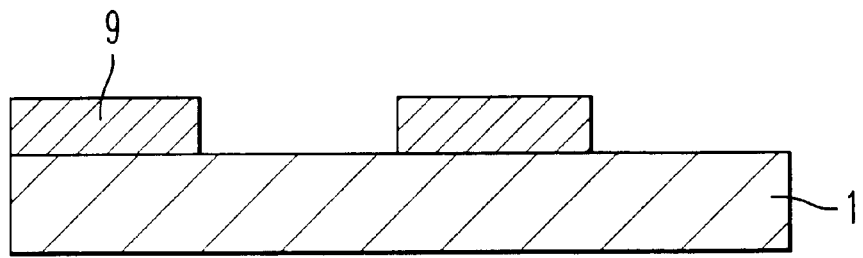
Figure 7B:
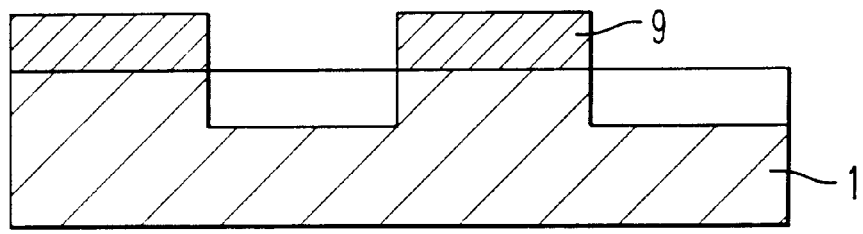
Figure 7C:
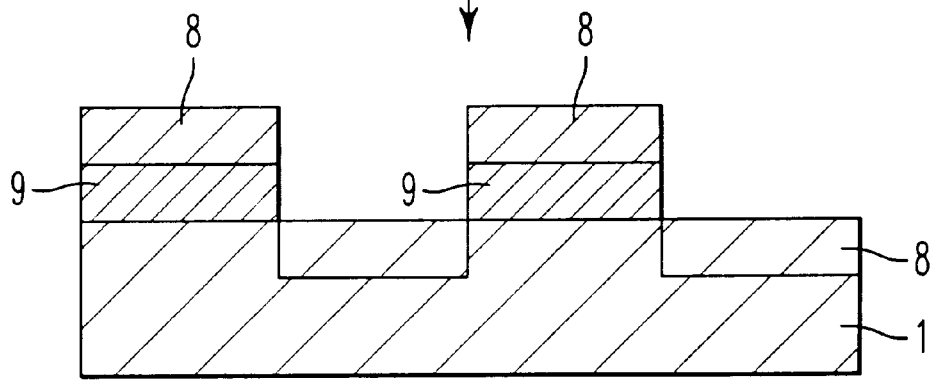
Figure 7D:
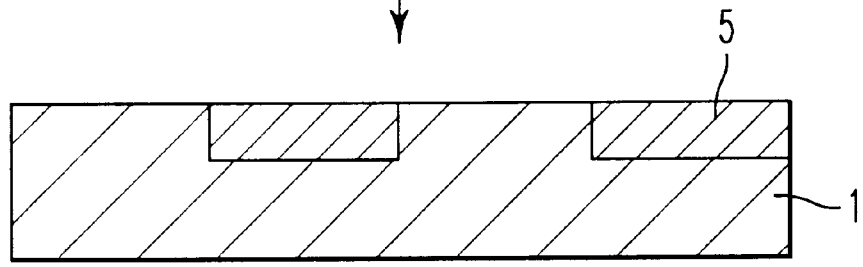

The planarization layer 6 may have a slight undulation as shown in FIG. 6(d). It is to be appreciated in this case that the degree of the undulation is such that no breakage occurs in the upper organic layer for EL element and the counter electrode layer by this undulation.

II. Second Invention (Organic EL Element Having Interlayer Insulating Film)

1. Basic Mode

In the second invention, as shown in FIG. 8(a), an auxiliary electrode 5 is covered with a flattened interlayer insulating film 11 provided between the auxiliary electrode 5 and an organic layer 3.

Accordingly, the wiring layer 5 is flattened in the same manner as the case of the first invention by the interlayer insulating film 11, so that the generation of steps attributable to the wiring layer 5 is suppressed, thereby effectively preventing a counter electrode 4 from breaking.

Furthermore, although the wiring layer 5 is electrically connected to the lower electrode 2, the interlayer insulating film 11 is formed so as to cover the wiring layer 5 in the present invention, so that there is no occurrence of a leak current due to the migration of electric charges from this wiring layer 5 into the organic layer 3, thereby providing an effective prevention against the cross talk.

A variant of the second invention can be for example a mode shown in FIG. 8(b). In this case, the lower electrode 2 and the wiring layer 5 are connected via a contact hole 7 to the interlayer insulating film 11.

Figure 9:
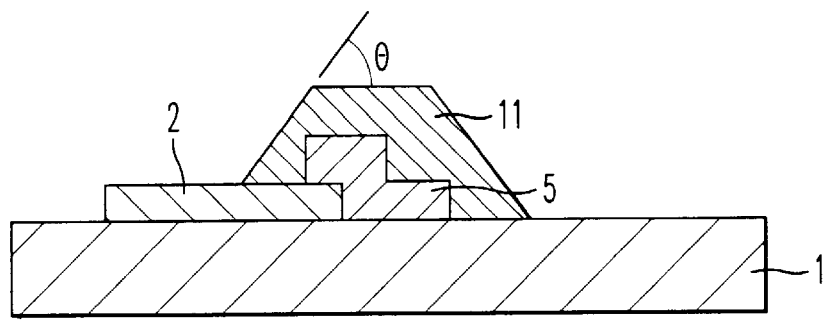
FIG. 9 is a schematic sectional view diagrammatically showing a taper angle of an interlayer insulating film in the second invention.

In case of the embodiment shown in FIG. 8, the interlayer insulating film 11 is formed with a taper having a taper angle ($\theta$) (an angle formed between upper one of two parallel sides and one of two nonparallel sides a trapezoidal section) preferably which is equal to or less than 45°, more preferably which is equal to or less than 25° as shown in FIG. 9.

The taper angle ($\theta$) exceeding 45° may result in an increased possibility of breakage and tend to cause any display defect, since the organic layer superposed on the interlayer insulating film 11 has a thickness as extremely small as 100 nm to 200 nm, with the counter electrode having a small thickness of the order of 200 nm.

2. Constituent Element

The second invention will hereinafter be described more specifically on a constituent element basis.

(1) Wiring Layer

The wiring layer can be the same as used in the first invention. It is to be appreciated that edges of the wiring layer are preferably tapered since it may be difficult to entirely eliminate the steps attributable to the auxiliary electrode in the embodiment shown in FIG. 8. In lieu of tapering the wiring layer, stepped portions of the interlayer insulating film described later may be tapered. This taper angle (an angle formed between upper one of two parallel sides and one of two nonparallel sides) is preferably which is equal to or less than 45° and more preferably which is equal to or less than 20°.

(2) Interlayer Insulating Film

The interlayer insulating film can be the same as used in the planarization layer in the first invention.

However, it is to be noted that the interlayer insulating film is different from the planarization layer in that point that it does not need not to be transparent. It is preferred that the thickness be within a range of 100 nm to several tens of microns so as to be able to have insulation properties and smooth the steps. It is preferred in this case that the interlayer insulating film be free from any pinholes (pinholeless) and have a large dielectric breakdown strength. This aims to prevent the injection of electric charges from the wiring layer into the organic layer. More specifically, oxides or nitrides conserving a dielectric breakdown strength which is equal to or more than 2 MV/cm, such as for example $SiO_2$, $Al_2O_3$, $Ta_2O_3$, $Si_3N_4$ and $Yb_2O_3$ are preferred. Furthermore, in order to prevent the counter electrode from breaking, it is necessary that the stepped portions of the interlayer insulating film could be tapered. The oxides such as $Al_2O_3$ and $Ta_2O_3$ prepared by anodizing method are particularly preferred since they are pinholeless and superior in the dielectric breakdown strength. The preparation could be made by a method in which a voltage of 10V to 300V is applied for oxidation with the above-described metals as the anode and platinum or other noble metals as the cathode in a dilute solution of e.g., ammonium citrate, ammonium phosphate, ammonium borate and ammonium tartrate.

(3) Other Constituent Elements

The other constituent element for use in the present invention can be the same as used in the first invention.

3. Method for Forming Wiring Layer and Interlayer Insulating Film (1) Anodizing Method (Part 1)

This method is a process in which the surface of a wiring layer is anodized to use the resultant oxide film as an interlayer insulating film.

Figure 10A:
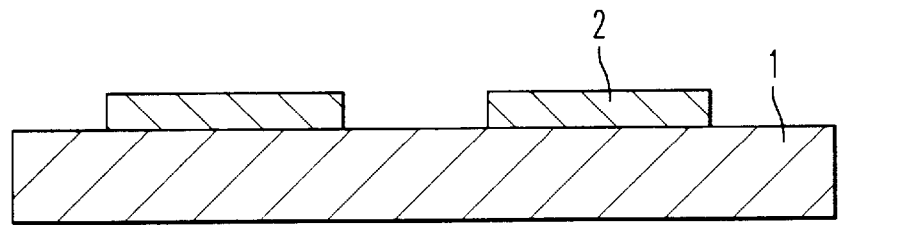
FIGS. 10a–10c are a schematic sectional view diagrammatically showing an example of a method for forming the wiring layer and the interlayer insulating film in the second invention.

As shown in FIG. 10(a), a patterned lower electrode 2 is formed on a substate 1.

Figure 10B:
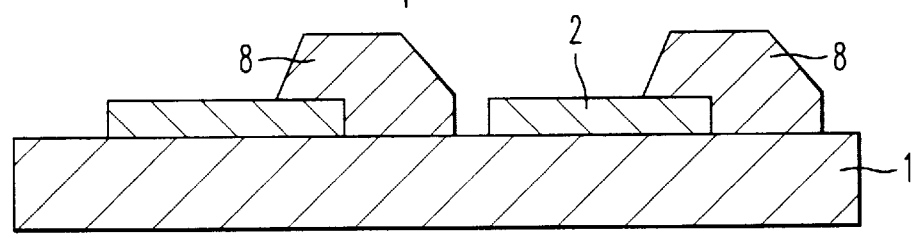

Then as shown in FIG. 10(b), a metal film 8 is formed and etched in accordance with a pattern of the wiring layer.

Figure 10C:
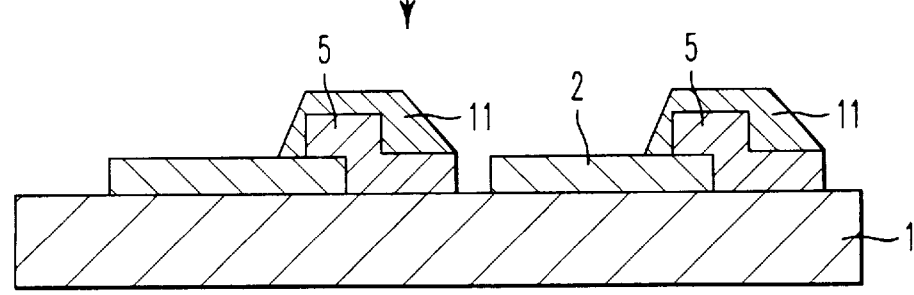

Then as shown in FIG. 10(c), the surface of the metal film 8 is anodized so that the resultant oxide film is used as an interlayer insulating film 11 with the remaining nonoxidized portion of the metal film 8 being used as a wiring layer 5.

(2) Anodizing Method (Part 2)

This method is a process in which after the formation of the wiring layer, the lower electrode is formed, after which portions of the wiring layer which have not been covered with the lower electrode are anodized to use them as the interlayer insulating layer.

Figure 11A:
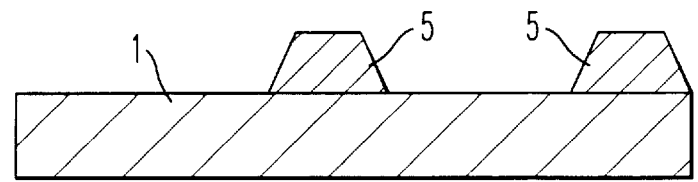
FIGS. 11a–11c are a schematic sectional view diagrammatically showing another example of the method for forming the wiring layer and the interlayer insulating film in the second invention.

As shown in FIG. 11(a), a patterned wiring layer 5 is formed on a substate 1.

Figure 11B:
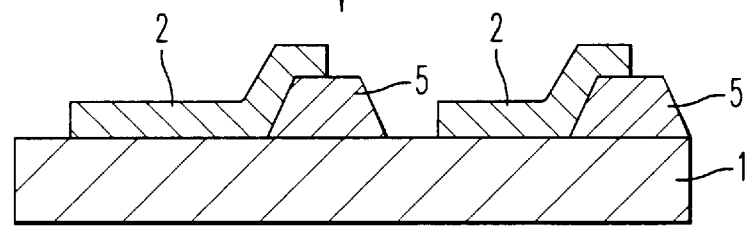

Then as shown in FIG. 11(b), a lower electrode 2 is patterned so as to connect to the wiring layer 5.

Figure 11C:
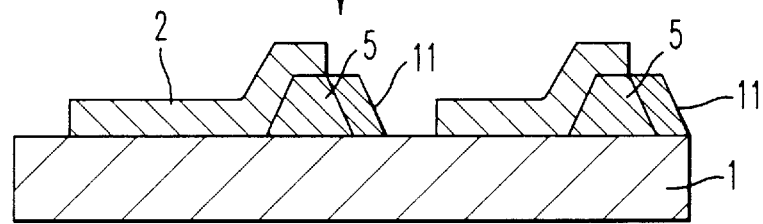

Then as shown in FIG. 11(c), portions of the wiring layer which have not been covered with the lower electrode 2 are anodized to oxide the surface thereof, allowing the oxidized portions to be used as an interlayer insulating layer 11.

(3) Flattening Method

This method is a process in which a wiring layer uncovered with a lower electrode is covered with an interlayer insulating film for flattening.

Figure 12A:
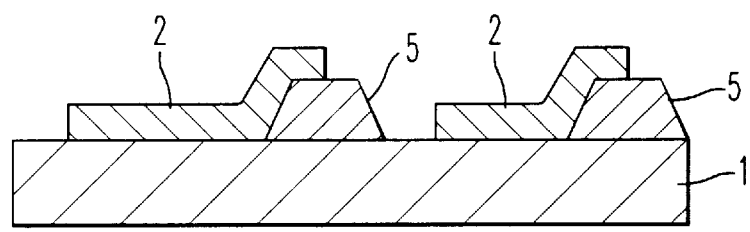
FIGS. 12a–12b are a schematic sectional view diagrammatically showing a further example of the method for forming the wiring layer and the interlayer insulating film in the second invention.

As shown in FIG. 12(a), a patterned wiring layer 5 and a patterned lower electrode 2 are formed on a substate 1 in the same manner as the case of the above (2).

Figure 12B:
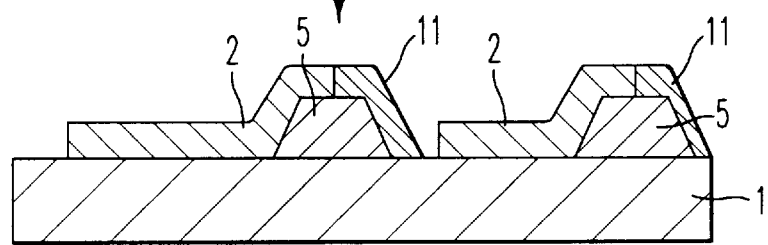

Then as shown in FIG. 12(b), an interlayer insulating film 11 is formed. In case of using an insulating polymer as the material of the interlayer insulating film 11, after the formation with the spin coating, the interlayer insulating film 11 is configured by photoetching method for example so as to cover the wiring layer 5 excepting the wiring connection to the lower electrode 2 or other exterior.

Surface Resistance Value and Width of Wiring Layer

The wiring layer for use in the first and second inventions is electrically connected to the lower electrode. As used herein, "electrically" means that when a power source is connected to the wiring layer and the counter electrode, the wiring layer and the lower electrode are connected with each other so as to allow a voltage to be applied to the organic EL element. It is therefore preferred that the wiring layer have a low surface resistance value since a current supplied to the organic EL element flows therethrough. More specifically, it is preferred that the surface resistance value should be equal to or less than 1 $\Omega/\square$. In case of making the lower electrode of a conventional material thin film having a resistance value which is equal to or more than $0.5 \times 10^{-4}$ $\Omega \cdot cm$, it may be difficult to achieve this value with a thickness within a range of 100 nm to 500 nm. If the thickness of the lower electrode is further increased to reduce the surface resistance value, significant steps may occur at the edges of the lower electrode, resulting in an inconveniences such as a breakage of the counter electrode. In case the lower electrode is a transparent electrode, the specific resistance is as large as $1 \times 10^{-4}$ $\Omega \cdot cm$ or more in the state of the art, so that further increased thickness results in an optical transmittance which is equal to or less than 80%, which may inconveniently reduce the luminescence emission efficiency.

Thus, by using the wiring layer having a surface resistance value which is equal to or less than 1 $\Omega/\square$ in the first and second inventions, it is possible to acquire an electrode line (wiring) having a low resistance, which could not be achieved by only the lower electrode. Furthermore, it is particularly preferred to use a wiring layer having a surface resistance value of 0.3 $\Omega/\square$. This is achieved by using a material with a low specific resistance which is equal to or less than 10 to 30 $\mu\Omega \cdot cm$, such as Al, Al:Ta, Al:Nd and Al:Ti. Since the wiring of the wiring layer ordinarily interferes with the emission of the luminescence from pixels, the width thereof is preferably smaller than the size of the pixels. The width is preferably equal to or less than 50 $\mu m$, particularly preferably equal to or less than 20 $\mu m$. On the contrary, the wiring of the wiring layer having a reduced width may add to the resistance of the wiring of the wiring layer. Even in case of a reduced width of 10 $\mu m$, however, use of the wiring layer having a surface resistance which is equal to or less than 0.3 $\Omega/\square$ would result in an acquisition of an allowable resistance value per cm which is equal to or less than 300 $\Omega$. It would therefore be preferred to use the wiring layer having a surface resistance which is equal to or less than 0.3 $\Omega/\square$ since the wiring having a resistance for 10 cm which is equal to or less than 5 k $\Omega$ is acquired.

In order to acquire the wiring of such a low resistance, it is necessary to make the wiring layer of the material having a low specific resistance which is equal to or less than 10 to 30 $\mu \Omega \cdot cm$ and to set the thickness of the wiring of the wiring layer to should be equal to or more than 200 nm. Although this is easily achieved, it becomes essential to flatten or planarize the steps of the wiring layer instead.

It becomes therefore essential to implant the wiring layer in the planarization layer or in the substrate using the first invention, or alternatively to employ the second invention in which the interlayer insulating film has been formed with the steps of the wiring layer being tapered if necessary.

Pattern Examples of Wiring Layer and Lower Electrode

The wiring layer used in the first and second invention is particularly effective in the application to a display forming an XY matrix by the lower electrode and the counter electrode. Such an XY matrix provides a display for a line sequential driving. At that time, the pulse current peak value increases since the current pulse is fed to a selected pixel by a time corresponding to the reciprocal of the (number of scanning lines)×(frame frequency). For this reason, there arises a need to reduce the electrode line (wiring) resistance by use of the wiring layer.

Such pattern examples for reducing the wiring resistance include ones shown in FIG. 13.

Dotted in FIG. 13(a) are connections of the lower electrode 2 and the wiring layer 5. In case the lower electrode 2 overlies the wiring layer 5, unconnected portions of the wiring layer 5 is covered with the planarization layer or the interlayer insulating film. In case the lower electrode 2 underlies the wiring layer 5, the entire wiring layer 5 is covered with the interlayer insulating film.

Dotted in FIG. 13(b) are connections of the wiring layer 5 and the lower electrode 2. Similarly, the wiring layer 5 is covered with the interlayer insulating film or the planarization layer.

The first and second inventions are applicable to the formation of double and triple or more matrix as well.

In case of a double matrix for example, as shown in FIG. 13(c), the odd numbered lower electrodes 2 and the even numbered lower electrodes 2 are connected to different wiring layers 5.

The above pattern examples are typical ones, and the present invention is not intended to be limited by them.

Figure 14:
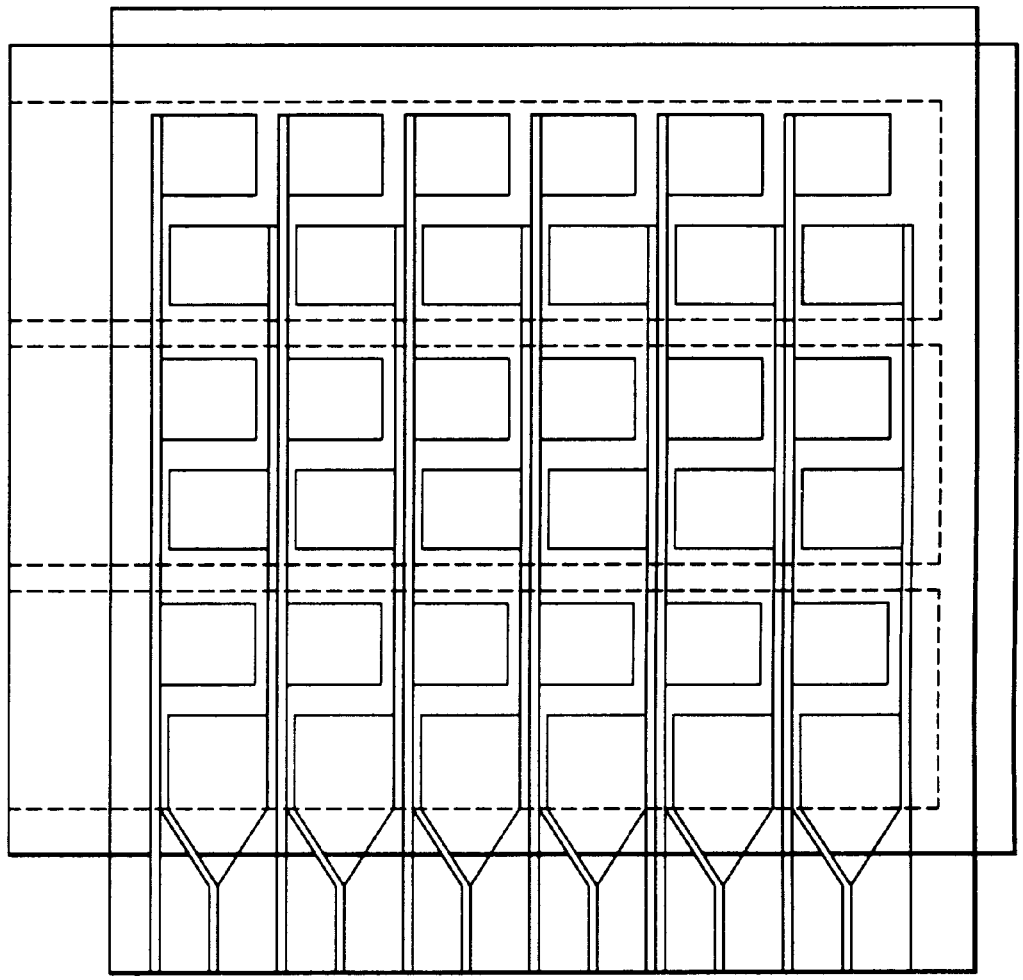
FIG. 14 is a schematic sectional view diagrammatically showing another example of the pattern of the wiring layer and the lower electrode in the present invention.
Figure 14A:
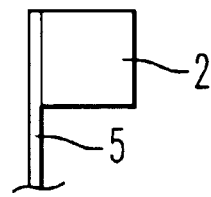
Figure 15:
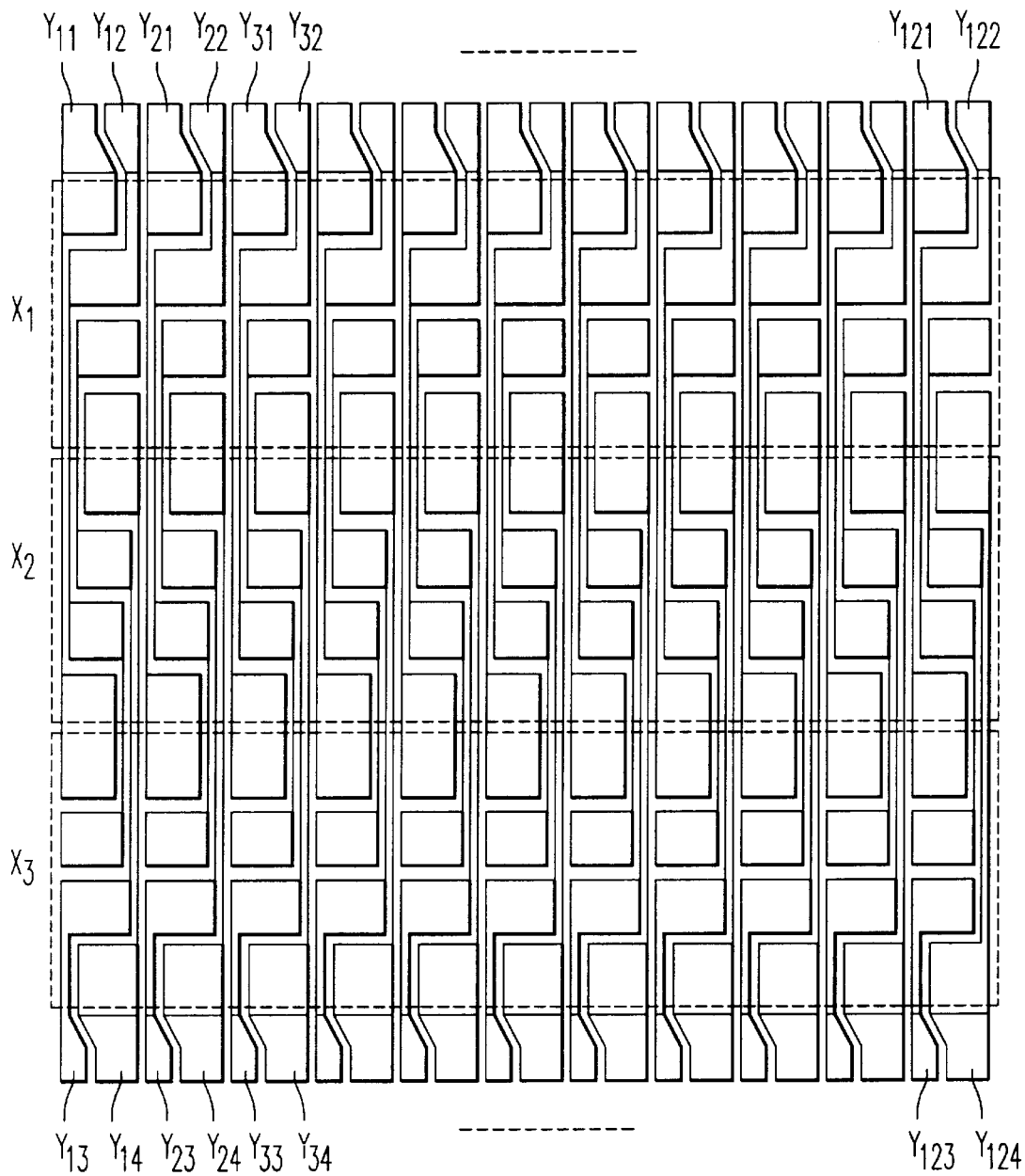
FIG. 15 is a schematic sectional view diagrammatically showing a further example of the pattern of the wiring layer and the lower electrode in the present invention.
Figure 15A:
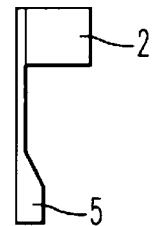

FIGS. 14 and 15 illustrate wiring patterns of displays using the double matrix and a quadruple matrix, respectively.

In the example illustrated in FIG. 14, the pattern of FIG. 13(c) is utilized to make up an XY matrix, with the lower electrode 2 serving as a signal electrode. It is to be noted in FIG. 14 that an X stripe (scanning electrode 4) as the counter electrode is also striped. Such an example of the double matrix has advantages for instance that the stress exerted on the element upon the drive of the display can be reduced due to halved drive duty and that a reduction in the applied voltage leads to a reduced power consumption.

In case of using the double matrix in the first and second inventions, there can be obviated the breakage of the counter electrode or cross talk which has been found in the prior art.

Also in the case of using the triple or more matrix as shown in FIG. 15, it is possible to utilize the present invention for the formation thereof. Besides, FIG. 15 illustrates an example of the quadruple matrix.

$X_1$, $X_2$, and $X_3$ represent the counter (scanning electrode 4) electrodes while $Y_{11}$, $Y_{12}$, $Y_{13}$, $Y_{14}$, . . . , $Y_{121}$, $Y_{122}$, $Y_{123}$ and $Y_{124}$ represent the lower (signal electrode) electrodes 2.

For example, a $\frac{1}{480}$ duty drive can also be reduced to $\frac{1}{120}$. For this reason, application of the technique of the present invention enables a high-definition TV and other display to be implemented. This is because the electrode line (wiring) resistance of the present invention is small enough to prevent the voltage drop from occurring as well as because there can be suppressed an increase of the response time which may arise in case of a larger wiring resistance.

In addition, the first and second inventions are applicable to an organic EL element using an active matrix. It is to be noted that the signal electrodes and the scanning electrodes of the XY matrix for use in the active matrix serve differently from the wiring of the wiring layer in the present invention. Although they are wirings for the supply of power to the lower electrode of the organic EL element in the present invention, the signal or scanning electrode of the active matrix is a wiring for providing an on/off control to the active element (transistor).

Furthermore, the signal or scanning electrode of the active matrix is used for the drive control of a field-effect transistor, so that the amount of current flowing therethrough is small, permitting a wiring having a relatively high resistance value.

Accordingly, the electrode line (wiring) with a low resistivity required in the first and second inventions is not necessarily needed. The active matrix uses the wiring of the wiring layer in the present invention as a common electrode line which is a wiring for the supply of current to the lower electrode of the organic EL element.

Provision of the common electrode line in the form of the wiring layer in the first and second inventions makes it possible to prevent a breakage of the counter electrode and to suppress the cross talk in the display and to realize the effect suppressing a voltage drop attributable to the wiring.

III. Third Invention (Organic EL Element Having Planarization layer: Part 2)

1. Basic Mode

Figure 17:
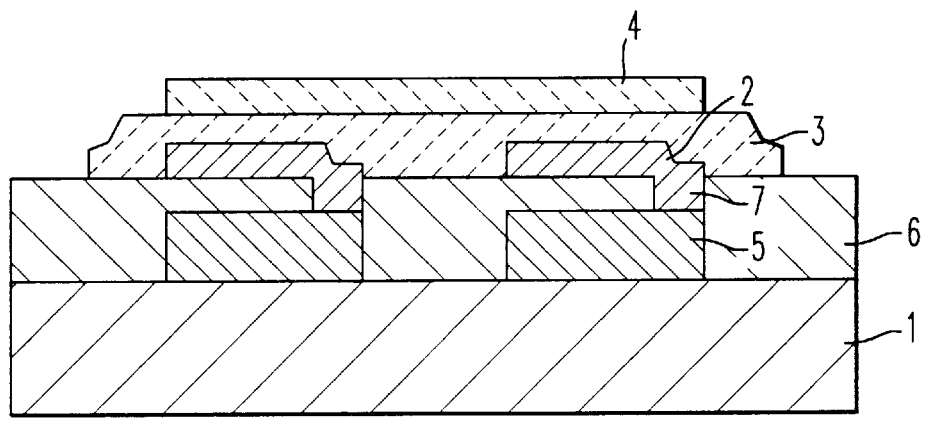
FIG. 17 is a schematic sectional view diagrammatically showing another embodiment of the organic electroluminescence element in accordance with the third invention.

A third invention relates to an organic EL element comprising as shown in FIG. 16 or 17 a substate 1, and thereon superposed in the mentioned order a lower electrode 2, an organic layer 3 including an organic luminescent layer, and a counter electrode 4. A wiring layer 5 for reducing the resistance value of the lower electrode 2 is implanted in a planarization layer 6 interposed between the substate 1 and the lower electrode 2.

Accordingly, the third invention is characterized in that the wiring layer 5 is not allowed to protrude upward from the lower electrode 2, so that there occur no steps attributable to the wiring layer 5, providing an effective prevention against a breakage of the counter electrode 4 in the same manner as the first and second inventions.

The wiring layer 5 is electrically connected to the lower electrode 2, although in the third invention the lower electrode 2 is disposed on top of the wiring layer 5 so as to cover the latter, so that there is no occurrence of a leak current arising from the injection of electric charges from this wiring layer 5 into the organic layer 3, providing an effective prevention against a cross talk in the same manner as the first and second invention. The third invention is further characterized in that it is possible to sufficiently reduce the resistance value of the lower electrode since the width of the wiring layer lies within a range of 20 to 150% of the width of the lower electrode layer.

Furthermore, in case of forming the wiring layer from a metal of 200 μm in wiring width and of 250 nm in thickness and having a specific resistance of $5\times10^{-6}$ Ω·cm for example, the resistance of the lower electrode layer having the same width as that of the wiring layer can be reduced to 10 Ω ($5\times10^{-6}$ Ω·cm/(200 μm×250 nm )) or below for unit length (1 cm) (in this specification, the resistance value for unit length means a resistance value for 1 cm in length; hereinafter may be abbreviated simply as a resistance value for unit length). As a result, the resistance value can be reduced to enough a small value to allow an application of parts comprised of the lower electrode layer and the wiring layer to the scanning electrode line in an organic EL display device having the XY matrix configuration.

Anther embodiment of the third invention can be one shown in FIG. 17 for example.

In this embodiment, as shown in FIG. 17, the wiring layer 5 is covered with the planarization layer 6 in such a manner that the electrical connection between the wiring layer 5 and the lower electrode 2 is effected by way of a contact hole 7 formed in the planarization layer 6. Also in this embodiment, the wiring layer 5 is not allowed to protrude upward from the lower electrode 2 in the same manner as the first and second invention, thereby effectively preventing a breakage of the counter electrode 4 and a cross talk from occurring. Furthermore, the possession of a sufficient wiring width enables the resistance to lower.

Moreover, this allows the above organic EL element to form an XY matrix by the lower electrodes and the counter electrodes, enabling luminous pixels to be formed at the intersections.

Figure 18:
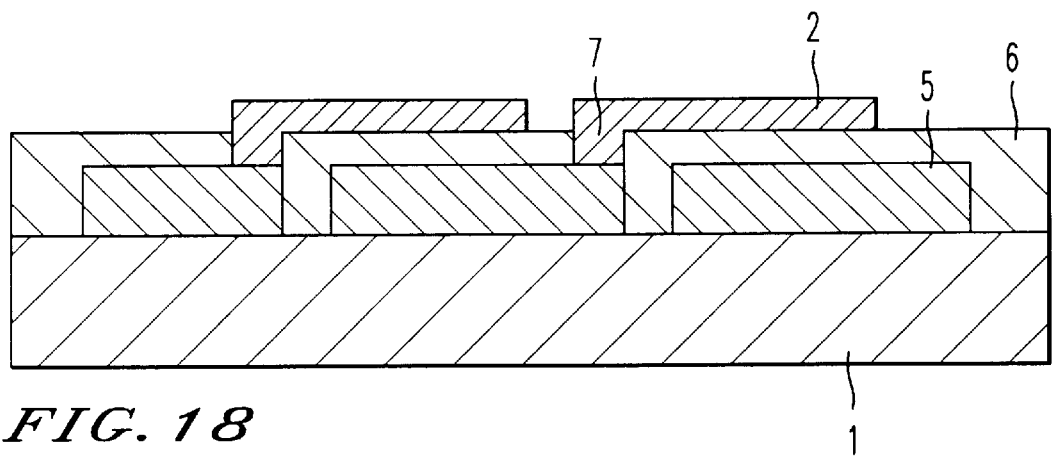
FIG. 18 is a schematic sectional view diagrammatically showing a further embodiment of the lower electrode and the wiring layer in accordance with the third invention.
Figure 19:
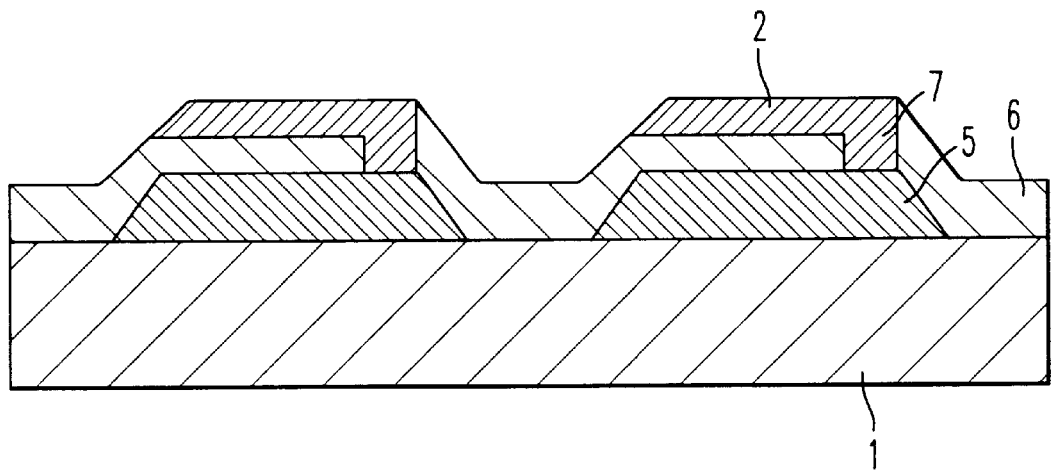
FIG. 19 is a schematic sectional view diagrammatically showing still another embodiment of the lower electrode and the wiring layer in accordance with the third invention.
Figure 20:
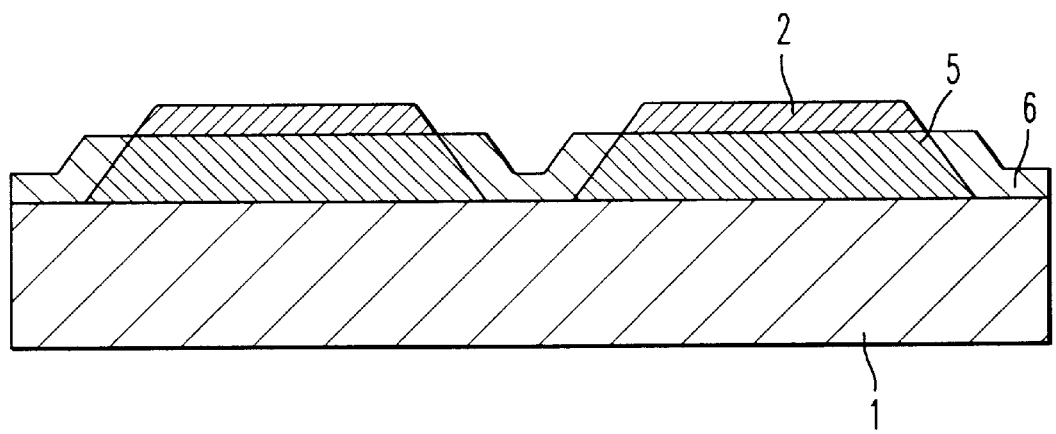
FIG. 20 is a schematic sectional view diagrammatically showing a still further embodiment of the lower electrode and the wiring layer in accordance with the third invention.

Embodiments different from those shown in FIGS. 16 and 17 include a mode as shown in FIG. 18 where the positional relationship between the wiring layer 5 and the lower electrode 2 has been translated, a mode as shown in FIG. 19 where no breakage occurs due to the trapezoidal in section (tapered) edges of the wiring layer although the thickness of the planarization layer 6 is smaller than that of the wiring layer 5, and a mode as shown in FIG. 20 where no use is made of the contact holes in spite of the similar mode to that of the FIG. 19.

2. Constituent Elements

The third embodiment will hereinafter be described more specifically on a constituent element basis.

(1) Lower Electrode

The lower electrode for use in the third invention can be the same as used in the first and second inventions.

(2) Wiring Layer

The wiring layer for use in the present invention is not particularly limited and can be the same as used in the first and second inventions as long as it has a width which is equal to 15 to 150% of the width (length of the short side) of the lower electrode.

In the third invention, the width of the wiring layer should be within a range of 15 to 150%, preferably 100 to 150% of the width of the lower electrode. This is because the width less than 15% may prevent the lower electrode from acquiring a sufficiently low resistance value but the width more than 150% may reduce the fill factor of the luminous pixels, making it difficult to increase the luminance. In case of the range of 100 to 150%, the luminescence is emitted from the counter electrode side.

The method for connecting the wiring layer and the lower electrode includes for example a method in which the lower electrode is provided over the entire surface of the wiring layer, a method in which the contact between the wiring layer and the lower electrode is effected by way of a contact hole provided in the planarization layer, and a method in which the lower electrodes constituting pixels are separately formed on the wiring layer on a pixel-to-pixel basis.

(3) Planarization layer

The planarization layer for use in the present invention can be the same as used in the first present.

In case of using inorganic materials, the method for forming this layer includes a thermal CVD method, an LPCVD method (low pressure CVD method), a PECVD method (plasma enhanced CVD method), a DC sputtering method, an AC sputtering method, an ECR sputtering method. It is desirable to select the temperature upon the formation of the layer in view of the heat resistance temperature of the substrate and the wiring layer. For example, it is preferable to form the layer in the condition that the substrate temperature of 80 to 400° C. is achieved. The condition allowing the substrate temperature exceeding 400° C. may possibly result in defects of the wiring layer which may lead to pixel defects. The anodizing method is applicable to the first invention.

This anodizing method is available as another inorganic material film deposition method. In this method, a metal such as aluminum (Al) tantalum (Ta) and an aluminum alloy allowing anodization is immersed in a neutral aqueous solution obtained by adding weak base components into weak acid aqueous solution containing boric acid, citric acid, etc. With platinum or other noble metal as the counter electrode (cathode) and with the above metal as the anode, a voltage of 150 to 300V is applied for oxidation to form a planarization layer made of an oxide. Al, Ta, Al alloys are suitable for the formation of a dense film free from any pinholes.

This layer formation method preferably employs a technique in which a solution of anorganic material, e.g., one of the above polymers or precursors thereof is spin coated or applied and then thermoset.

It is to be appreciated that the planarization layer may be formed from the same glass material as that of the substrate and that in this case the glass used as the substrate may partially be processed to make up the planarization layer.

The same method is applicable to the first invention.

The planarization layer has only to have a thickness enough to implant the wiring layer therein, and as shown in FIGS. 19 and 20 the thickness thereof may be smaller than that of the wiring layer depending on the geometries of the wiring layer.

(4) Other Constituent Elements

The other constituent elements can be the same as used in the first and second inventions.

3. Method for Forming Lower Electrode, Wiring Layer and Planarization layer

The formation method is not limited to a particular method, but preferred examples can be the following methods.

(1) Etch Back Method

Figure 21A:
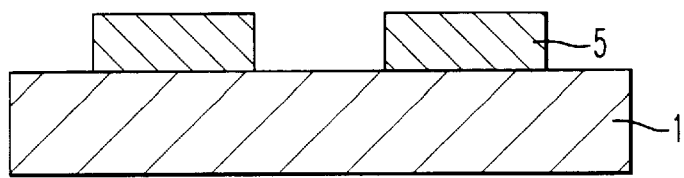
FIGS. 21a–21e are a schematic sectional view diagrammatically showing an example of a method for forming the lower electrode, the wiring layer and the planarization layer in the third invention.

This method is a process in which a wiring layer is coated with an inorganic insulating film and then with an organic polymer, after which it is subjected to plasma etching or reactive ion etching to thereby planarize(flatten) its surface. As shown in FIG. 21(a), a material to form the wiring layer is deposited to a predetermined thickness on a substate 1 by a known film deposition method such as vapor deposition, sputtering or CVD method, after which it is patterned by photolithography to form a wiring layer 5.

Figure 21B:
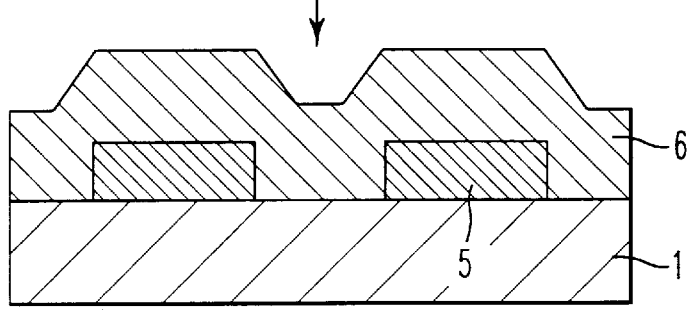

Then as shown in FIG. 21(b), an inorganic insulating film of $SiO_2$, $SiO_x$ ($1 \leq x \leq 2$), $Si_3N_4$, etc., is formed over the wiring layer 5 by means of the above-described various CVD methods or the sputtering method.

Figure 21C:
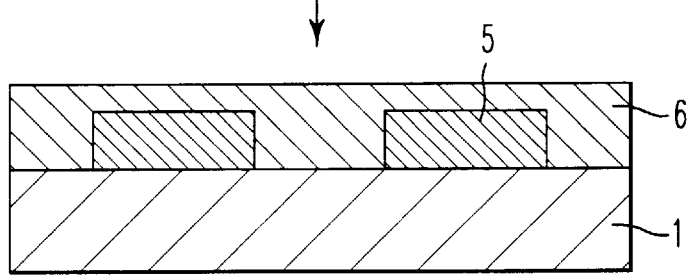

Then the surface of the inorganic insulating film is coated with an organic polymer (the organic polymer layer is not shown) for planarizing(flattening), after which it is uniformly etched by the reactive etching for example using a mixture gas of $CF_4$ and oxygen, to form a planarization layer 6 as shown in FIG. 21(c).

Figure 21D:
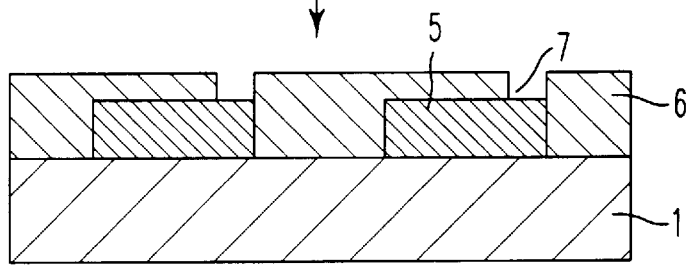

Then contact holes are provided as shown in FIG. 21(d) by means of photolithography.

Figure 21E:
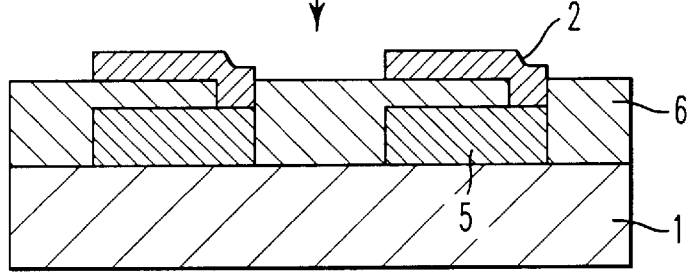

Finally, a lower electrode is formed by sputtering for example and patterned by photolithography to obtain the wiring layer 5 implanted in the planarization layer 6 as shown in FIG. 21(e).

The same method is applicable to the first invention.

(2) Lift-off Method

This method is a process in which after the formation of a planarization layer on a substrate, a metal film is formed thereon. In case of making the planarization layer of a transparent polymer, a typical film deposition method is the spin coating method, the coating method, the immersion coating or other methods. In case of using oxides, glass, etc., the vapor deposition method, the sputtering method, the CVD method, the anodizing or other methods are available.

Figure 22A:
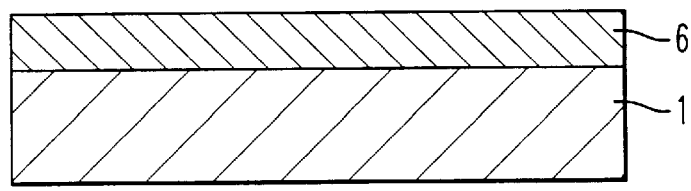
FIGS. 22a–22e are a schematic sectional view diagrammatically showing another example of the method for forming the lower electrode, the wiring layer and the planarization layer in the third invention.

As shown in FIG. 22(a), a planarization layer 6 is first formed on a substate 1.

Figure 22B:
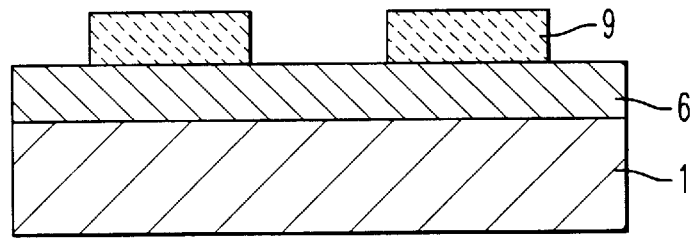

Then as shown in FIG. 22(b), a photoresist is coated on the planarization layer 6 and is exposed to light so that a photoresist 9 is positioned with apertures corresponding to patterned portions forming a wiring layer.

Figure 22C:
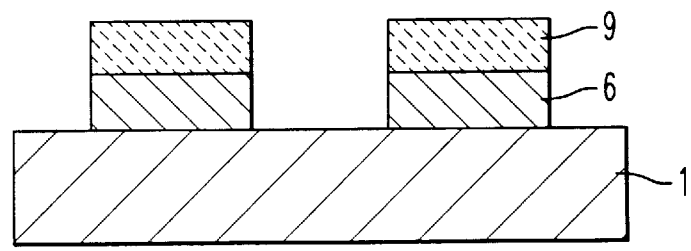

Then as shown in FIG. 22(c), portions of the planarization layer which have not been masked by the photoresist 9 is etched for removal.

Figure 22D:
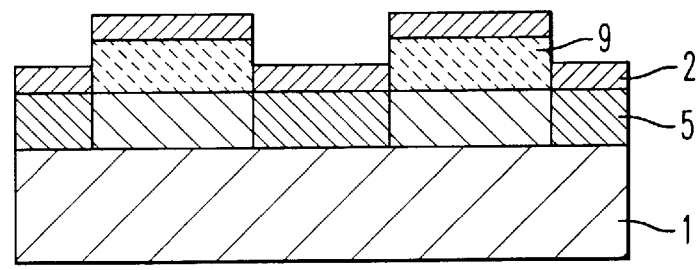

Then a wiring layer 5 is formed by a known film deposition method, which is followed by the deposition of a lower electrode layer as shown in FIG. 22(d).

Figure 22E:
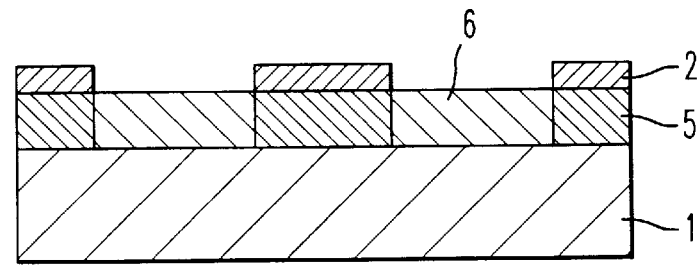

Afterwards, as shown in FIG. 22(e), the photoresist 9 together with the lower electrode lying thereon is removed, thus allowing the formation of the wiring layer 5 within the planarization layer 6, as well as the formation of the lower electrode 2 thereon.

In case a desired thickness of the wiring layer 5 is as large as one to several tens of microns, metal plating method may be used after the initial formation by vapor deposition, sputtering or CVD method. The employment of this method enables the film deposition time to be reduced.

This method is also applicable to the first invention.

(3) Anodizing Method

This method is a process in which a planarization layer is formed by use of anodizing method.

Figure 23A:
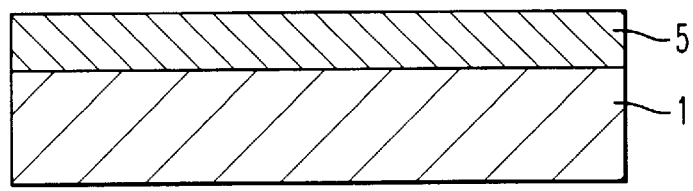
FIGS. 23a–23e are a schematic sectional view diagrammatically showing a further example of the method for forming the lower electrode, the wiring layer and the planarization layer in the third invention.

As shown in FIG. 23(a), a metal or alloy allowing anodization is deposited on a substate 1 by means of various CVD methods, sputtering method, or vapor deposition method.

Figure 23B:
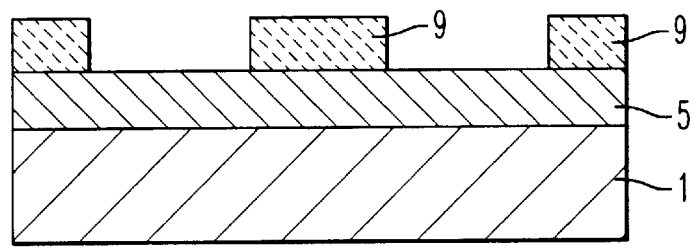

Then as shown in FIG. 23(b), a photoresist is coated and exposed to light for setting, to thereby allow portions having no planarization layer thereon to remain.

Figure 23C:
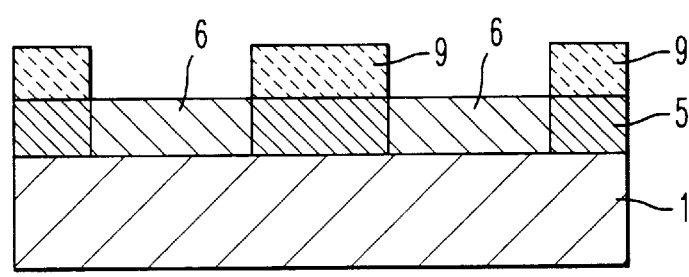

Then the thus treated substrate is immersed in an anodizing liquid and supplied with an electric current to oxidize portions resulting in the planarization layer (portions having no photoresist thereon) (FIG. 23(c)).

Figure 23D:
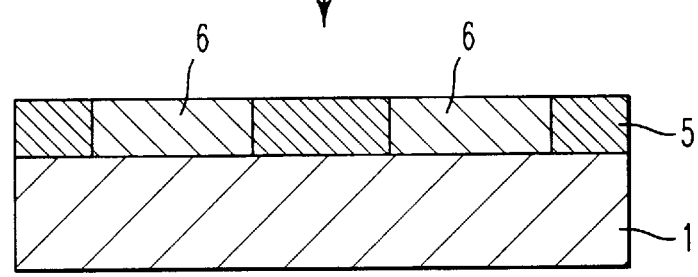
Figure 23E:
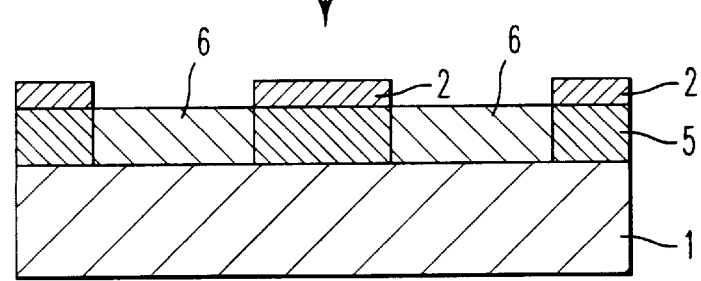

Then the photoresist 9 is removed (FIG. 23(d)), after which a lower electrode layer is formed and as shown in FIG. 23(e) is patterned by lithography, allowing a wiring layer 5 connecting to the lower electrode 2 to be formed within the planarization layer 6.

This method is also applicable to the first invention.

(4) Polymer Planarizing Method

This method is a process in which a planarization layer is superposed on a wiring layer pattern to thereby provide contact holes as described hereinbefore.

Figure 24A:
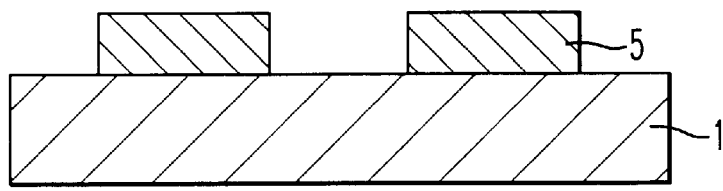

As shown in FIG. 24(a), a wiring layer pattern 5 is formed on a substate 1 by means of the lift-off method for example.

Figure 24B:
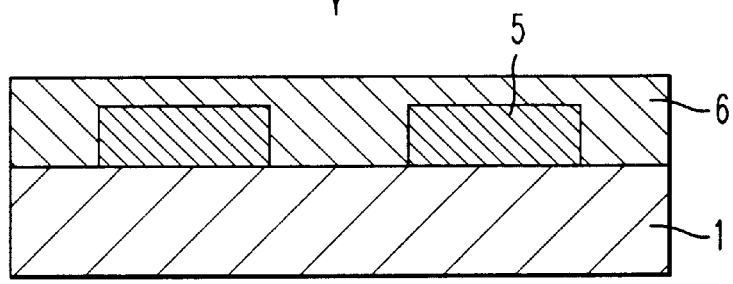

Then as shown in FIG. 24(b), a planarization layer 6 is formed using a polymer in such a manner as to cover the wiring layer pattern 5. The formation method can be for example spin coating, the coating method, the vapor deposition method, the CVD method or the sputtering method. In case the polymer used herein has a photosensitivity, the contact hole portions may simultaneously be provided.

Figure 24C:
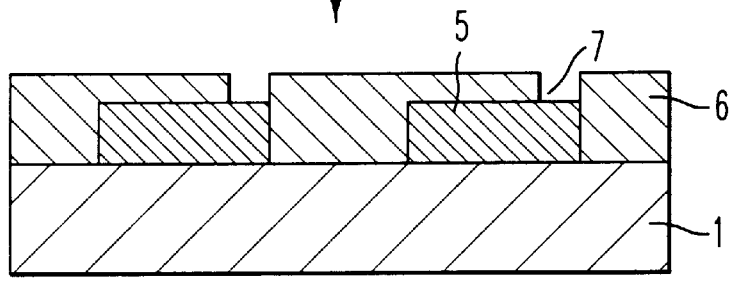
Figure 24D:
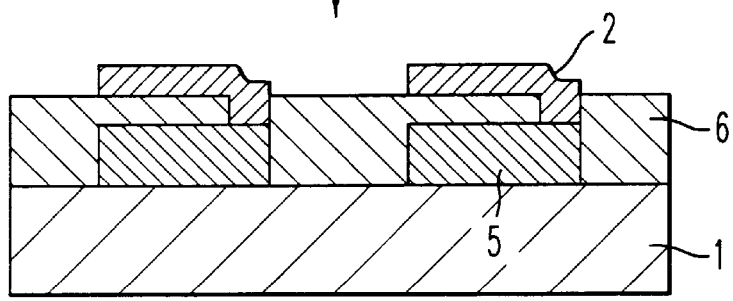

Then as shown in FIG. 24(c), contact holes 7 are provided in the planarization layer 6 by etching using a photoresist. In order to prevent a layer formed thereon from breaking, it is preferred that the contact holes be downwardly tapered (upwardly flared). By connecting the lower electrode to the wiring layer 5 by way of these contact holes 7, it is possible to obtain a structure shown in FIG. 24(d).

IV. Fourth Invention (Organic EL Display Device Using Organic EL Element Having Planarization layer)

A fourth invention relates to an organic EL element display device using an organic EL element having substantially the same configuration as that of the organic EL element of the first and third inventions.

The organic EL display device of the present invention comprises a plurality of scanning electrode lines and a plurality of signal electrode lines which intersect the plurality of scanning electrode lines, with the intersection areas being providing with luminous pixels in arrays. Each luminous pixel is formed from an organic EL element comprising a substrate, thereon superposed in the mentioned order a lower electrode, an organic layer including an organic luminescent layer, and a counter electrode.

Herein, the scanning electrode lines serve to transmit a scanning signal upon a simple matrix drive of the luminescent device, whereas the signal electrode lines serve to feed a signal current for selecting a luminous pixel to be activated, to the scanning electrode line selected by the scanning signal.

Although the signal electrode line of the fourth invention is an electrode line including a counter electrode, as used herein the including the counter electrode means that the electrode line includes in addition to the counter electrode a wiring for feeding a selection signal current connected to the electrode.

(1) Luminous Pixel

The luminous pixel of the fourth invention is formed from the organic EL element having the above configuration. The lower electrode is connected to a wiring layer, and the wiring layer is implanted in a planarization layer interposed between the substrate and the lower electrode. The width (length of the short side) of the wiring layer is preferably equal to 20 to 150% of the width (length of the short side) of the lower electrode.

The organic EL element constituting the fourth invention can be fabricated using the same materials and the same methods as those for the organic EL element set forth in the first and third inventions. It is also possible to employ the same configurations as set forth in the first and third inventions.

(2) Scanning Electrode line

The scanning electrode line of the fourth invention comprises a lower electrode and a wiring layer connected thereto.

In case of 2-split passing drive of an organic EL display device at a duty of $\frac{1}{120}$, the device having 240×360 pixels with 200 $\mu$m×300 $\mu$m each, acquisition of a luminance of 200 cd/m$^2$ requires instantaneously as a high luminance as 120×200=24,000 cd/m$^2$. In this case, full activation of the pixels of 10 cd/A, extremely a high level of luminous efficiency, would cause a large current of the order of 52 mA to flow instantaneously ($\frac{1}{120}$×1/frame frequency time (second)) to flow through the scanning electrode lines. This current value is a value obtained when the display fill factor is 100%. If the fill factor is from 50 to 70%, a higher luminance is required, which may possibly cause an instantaneous flow of as large a current as 100 mA. Furthermore, the luminous efficiency less than 10 cd/A requires an even larger current value.

At that time, if the resistance value for unit length of the wiring layer (in other words, the resistance value for unit length of the scanning electrode line) is of the order of 100 Ω which is a standard of the prior art, with the length of the scanning electrode line being 10 cm, the value of voltage drop upon the full activation is evaluated to be (52 mA×1K Ω)/2=26V, which may result in a difficulty with a low voltage drive and in an increase in the power consumption, thus making it thoroughly impossible to use as a display. From a viewpoint of a reduction in the power consumption, the resistance value of the scanning electrode line is preferably less than 15 Ω for unit length (1 cm).

In case of disposing e.g., a 250 nm thick, 200 $\mu$m wide wiring layer with a specific resistance of 5×10$^{-6}$ Ω·cm under the lower electrode in the fourth invention, a resistance of at most 10 Ω for unit length (1 cm) is available.

In case of the fourth invention, the provision of the planarization layer makes it possible to prevent any breakage of a layer superposed on the lower electrode layer even though the thickness of the wiring layer has been increased to reduce the resistance value. For this reason, the thickness of the wiring layer can be one to several tens of microns so that the resistance value for unit length (1 cm) can remarkably be reduced to several ohms to several-tenths ohms.

Table 2 illustrates, in a form corresponding to the resistance for unit length (1 cm) of the scanning electrode line, a voltage drop and a power loss which may occur in case of 2-split passing drive of an organic EL display device at a duty of $\frac{1}{120}$, the device having 240×360 pixels with 200 $\mu$m×300 $\mu$m each. In order to obtain the voltage drop, the luminous efficiency and the luminance were assumedly 10 cd/A and 200 cd/m$^2$, respectively.

TABLE 2

| Resistance For Unit Length (Ω) | Resistance For 10 cm (Ω) | Voltage Drop (V) | Power Loss Due To Resistance |
|---|---|---|---|
| 100 | 1000 | 26 | 0.9 |
| 10 | 100 | 2.6 | 0.09 |
| 1 | 10 | 0.26 | 0.009 |
| 0.1 | 1 | 0.026 | 0.0009 |

In Table 2, when the resistance value for unit length is 100 Ω which is a conventional standard, the drive voltage is high with a large power consumption as described hereinabove, causing the display device to suffer from a disadvantage. With the resistance value of 10 Ω, the voltage drop is 6V within a permissible range with a reduced power loss, so that use as the display device may be possible, but it is desired to further reduce the resistance value to suppress unevenness in the luminescence attributable to the voltage drop. The fourth invention enables the resistance value for unit length to be reduced to several ohms to several-tenth ohms as described hereinabove, so that the voltage drop is negligible, preventing a degradation in performance such as the inuniformity of the luminescence attributable to the voltage drop.

(3) Signal Electrode line

The signal electrode line comprises a counter electrode or a combination of a counter electrode and a wiring connected thereto. The counter electrode used herein may act either as an anode or a cathode, although it requires a certain degree of optical transmission when luminescence is emitted from the counter electrode side. A preferred optical transmission is equal to or more than 30% in a luminous waveform to be emitted. A material of the optically transmissive anode can be electrically conductive transparent oxides such as In—Sn—C, ZnO: Al (a mixture obtained by adding Al to ZnO), In—Zn—O and $SnO_2$: Sb (a mixture obtained by adding Sb to $SnO_2$) full-conjugated polymers having a high transparency such as polyaniline; graphite; and semiconductors such as α-carbon. A preferred material of the optically transmissive cathode includes a metal or alloy less than 20 nm in thickness having a low work function; and the metal or alloy having an electrically conductive transparent oxide film deposited thereon. When no optical transmission is needed, the same material as that of the lower electrode described above is available.

A current flowing through the signal electrode line is 0.14 mA (52 mA/360=0.14 mA) in case the above luminescent device (the organic EL display device having 240×360 pixels with 200 μm×300 μm each) is used at a luminance of 200 cd/m², so that a higher resistance value than that of the scanning electrode line is permissible. For example, the voltage drop at the resistance value of 5 kΩ is 0.7V, and hence such a level of resistance value is acceptable.

(4) Display Device

Table 2 illustrated in a corresponding form the voltage drop and the resistance for unit length of the scanning electrode line in case of an EL display device with diagonal line of 5 inches conforming to QVGA standard. In this event, the resistance of 10 Ω is also usable as described above. In case of a large-size screen which is equal to or more than 14 inches and a high-definition EL display device of VGA or upper (for example, 14-inch VGA, 14-inch SVGA, 14-inch XGA), the duty may be equal to or less than 1/240 with scanning electrode line which is equal to or more than 20 cm, so that the resistance value for unit length must be several ohms to several-tenths ohms. Due to its capability of using a wide wiring layer, the organic EL display device of the fourth invention can realize such a low resistance and therefore achieve a larger size of screen with a higher definition.

Furthermore, the fourth invention is applicable to the organic EL display device using an active matrix.

V. Fifth Invention (Organic EL Element Having Trapezoidal Layer Formed From Lateral Layer And Wiring Layer)

1. Basic Mode

Figure 25:
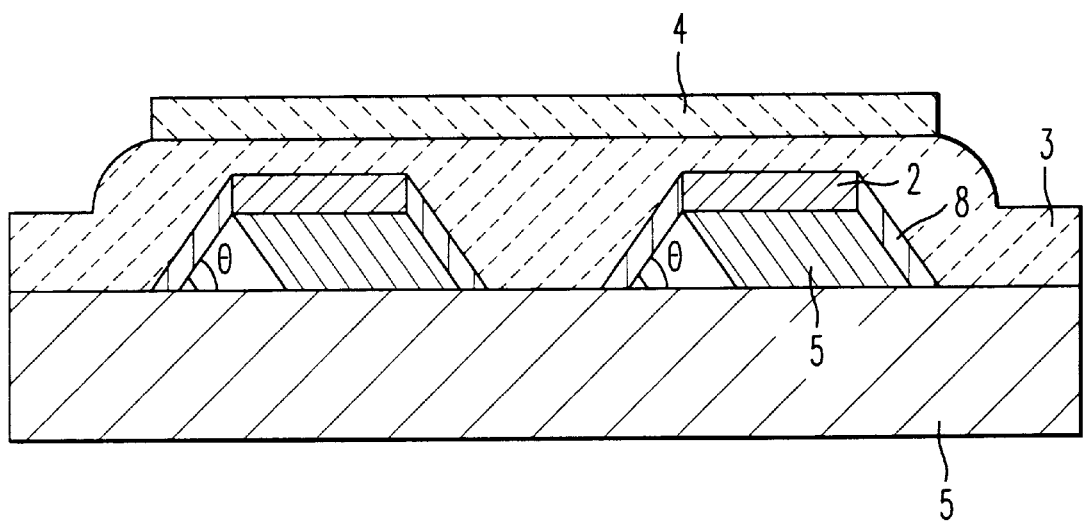
FIG. 25 is a schematic sectional view diagrammatically showing an embodiment of an organic electroluminescence element in accordance with a fifth invention.

A fifth invention relates to an organic EL element comprising as shown in FIG. 25 for example a wiring layer 5 having a trapezoidal (tapered) shape in section, the wiring layer 5 being covered with a lower electrode 2 and a lateral layer 8 which are provided between the wiring layer 5 and an organic layer 3. The formation of the lateral layer 8 suppresses the occurrence of image defects at that portion.

By virtue of its sectional shape, the wiring layer 5 is substantially planarization in the same manner as the case of the first and third inventions by the lower electrode 2 and the lateral layer 8, so that occurrence of steps arising from the wiring layer 5 is relieved, providing an effective prevention against the breakage of a counter electrode 4.

The wiring layer 5 is electrically connected to the lower electrode 2 although in the fifth invention the lower electrode 2 and the lateral layer 8 are formed in such a manner as to cover the wiring layer 5, so that there is no occurrence of an abnormal leak current attributable to the injection of electric charges from the wiring layer 5 into the organic layer 3, providing an effective prevention against the cross talk.

It is preferred that the section of the wiring layer (or the section of a layer formed from the lateral layer and the wiring layer) have a taper angle (θ) (an angle formed between the lower one of two parallel sides and one of two non-parallel sides of the trapezoidal section; see FIG. 25) which is equal to or less than 45°, preferably which is equal to or less than 25°.

Due to as extremely a small thickness as 100 nm to 200 nm of the organic layer provided on top of the lower electrode 2, and due to a small thickness of the order of 200 nm of the counter electrode, the taper angle exceeding 45° may enhance the possibility of a breakage, tending to cause the display defects.

2. Constituent Elements

The fifth invention will hereinafter be described more specifically on a constituent element basis.

(1) Wiring Layer

The wiring layer functions in the same manner as in the first to third inventions. For this reason, the same as used in the first to third inventions can be used. Since it may be difficult for the example shown in FIG. 25 to entirely eliminate the steps caused by the wiring layer, however, the edges of the wiring layer are preferably tapered. Instead of tapering the edges of the wiring layer, the stepped portions of the lateral layer described later may be tapered. This taper angle (the angle formed between the lower one of two parallel sides and one of two non-parallel sides of the trapezoidal section) is preferably equal to or less than 45°, and more preferably 5 to 25° as described above. The tapering eliminates any possibility of reduction of thickness or breakage of the organic layer or counter electrode layer at the edges of the pattern, thereby preventing a possible short-circuit or leak current.

It is also necessary for the wiring layer to be connected to the lower electrode at its bottom. This is because it is advantageous in preventing extraordinary migration of electric charges from the wiring layer into the organic layer. In case the wiring layer is positioned above the lower electrode or laterally thereof, there arises a need to provide an interlayer insulating film in addition to the lateral layer, thus complicating the configuration of the organic EL element and the fabricating process. It is to be noted that as long as a configuration is employed in which the wiring layer is isolated from the organic layer by the lower electrode and the lateral layer, there is no need to entirely locate the wiring layer under the lower electrode.

Furthermore, due to the same reason as the third invention, the width of the wiring layer is preferably 20 to 150%, more preferably 100 to 150%.

(2) Lateral Layer

The organic EL element of the fifth invention has a lateral layer at the side of the wiring layer. This lateral layer serves to make definite the threshold value of the current-voltage curve of the organic EL element to prevent an occurrence of the cross talk.

The material of the lateral layer is not particularly limited as long as it has the following functions. Available materials are as follows.

(i) Insulating Material

More specifically, the same material as used for the planarization layer of the first and third invention can be used. Oxides of the metals or alloys for use as the material of the wiring layer such as $Al_2O_3$, $Ta_2O_3$ and $TiO_2$ for example are also available. In this case, the anodizing method can be used to make oxide films of the above metals and alloys.

(ii) Such a material similar to the material of the lower electrode can be for example In—Sn—O, ZnO: Al, In—Zn—O, $SnO_2$: Sb, etc. In this case, a configuration could be employed in which the wiring layer is covered with the lower electrode.

(iii) In case the lower electrode acts as the anode, use can be made of metals having a work function which is equal to or less than 4.2, such as for example aluminum, aluminum alloys, etc.

(iv) In case the lower electrode acts as the anode, use can be made of metals having a work function which is equal to or more than 5eV, such as for example Au, Pt, Ni, etc., and alloys thereof such as Au-Al alloy, Pt-Al alloy, Ni-Al alloy, etc.

The use of above materials enables the amount of injection of the electric charges from the lateral tapered portion to be suppressed to 1/50 or below of the amount of injection of the electric charges from the lower electrode, thereby making it possible to remarkably reduce the occurrence of the leak current. Another reason to provide the lateral layer is that the tapered portion of the wiring layer may cause an extraordinary current injection due to the etching remainder or defects, tending to give birth to a short circuit or leak current. In the event that the wiring layer suffers from the etching remainder or defects, it is preferred to use the lateral layer made of the above material.

In case of making the lateral layer of the same material of the lower electrode layer, such an effect is obtained that a normal injection of electric charges is achieved by covering the entire wiring layer.

Furthermore, in case the amount of injection of the electric charges from the lateral tapered portion can be suppressed to 1/50 or below of the amount of injection of the electric charges from the lower electrode, the wiring layer and the lateral layer may be made of the same material and formed integrally. Such a material can specifically be Al, Al alloys, Mo, Mc alloys, etc.

(3) Other Constituent Elements

The other constituent elements for use in the present invention, more specifically, the substrate, the lower electrode, the organic layer including the organic luminescent layer, and the counter layer can be the same as used in the first to third inventions.

3. Methods for Forming Wiring Layer, Lower Electrode and Lateral Layer (1) Lift-off Method (Part 1)

This method is a process in which the wiring layer is formed and then is patterned by use of a photoresist, after which the lower electrode is superposed thereon.

Figure 26A:
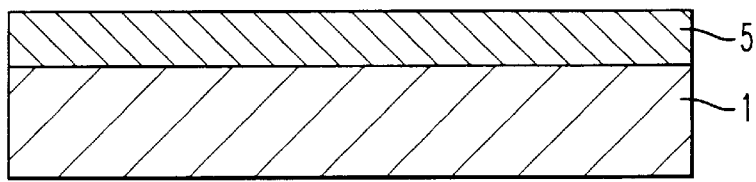
FIGS. 26a–26e are a schematic sectional view diagrammatically showing an example of a method for forming the lower electrode, wiring layer and planarization layer in the fifth invention.

As shown in FIG. 26(a), a wiring layer is first formed on a substate 1. A technique for forming the wiring layer can include vapor deposition method, sputtering method, and CVD method.

Figure 26B:
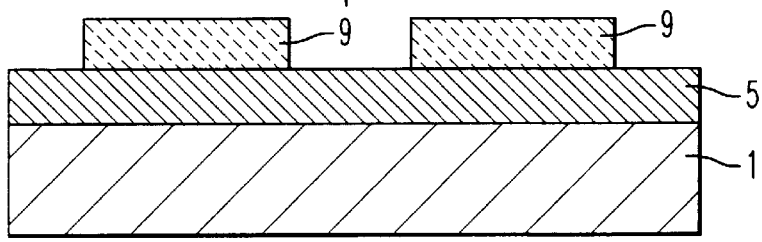

Then as shown in FIG. 26(b), a photoresist is coated for patterning on a region where a wiring layer is to be formed.

Figure 26C:
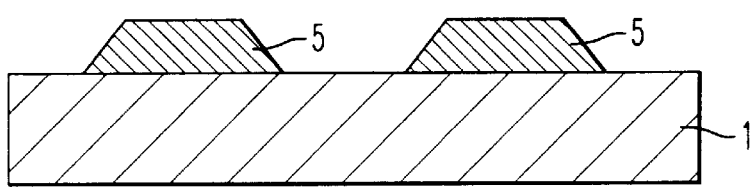

Then as shown in FIG. 26(c), reactive ion etching is used to etch or remove unnecessary portions of the photoresist and the wiring layer. The tapering of the wiring layer can be carried out by a mixture gas of $CF_4$ and oxygen. The mixing ratio ($CF_4/O_2$) of CF4 and the oxygen is preferably 0.6 to 1.

Figure 26D:
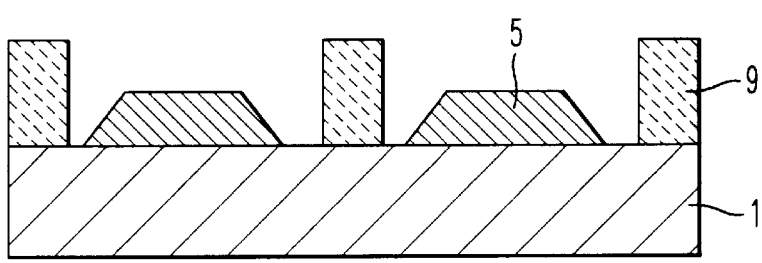

Then as shown in FIG. 26(d), a photoresist is disposed on regions where the lower electrode and the lateral layer are not formed. At that time, the exposure to light from the reverse side of the substrate would enable a photoresist pattern to be formed without using a photomask.

Figure 26E:
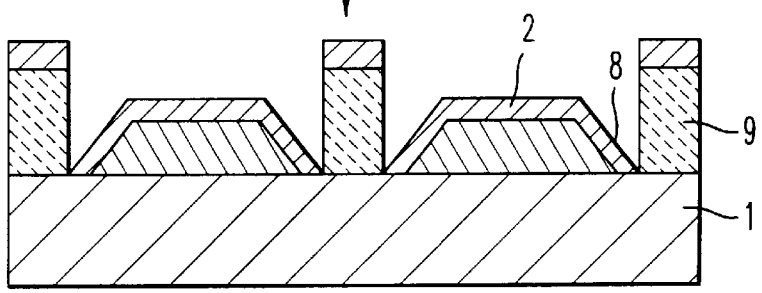

Then as shown in FIG. 26(e), the lower electrode and the lateral layer are formed by vapor deposition method or sputtering method, after which the photoresist 9 is removed together with the lower electrode layer resting thereon, to obtain a lower portion of the organic EL element of the fifth invention.

It is to be appreciated that in case of FIG. 26 the lower electrode and the lateral layer are simultaneously made of the same material.

(2) Lift-off Method (Part 2)

Figure 27A:
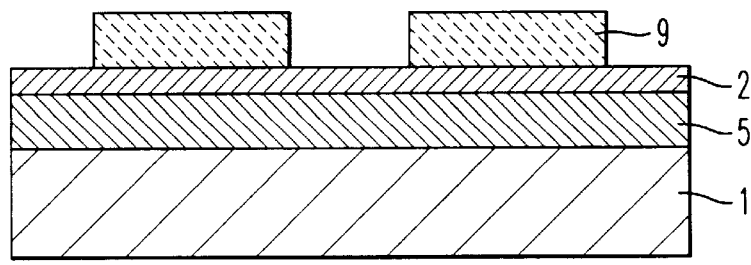
FIGS. 27a–27e are is a schematic sectional view diagrammatically showing another example of the method for forming the lower electrode, wiring layer and planarization layer in the fifth invention.

Using the technique of the lift-off method (Part 1, as shown in FIG. 27(a), a wiring layer and a lower electrode is formed on a substate 1, and a photoresist 9 is coated for patterning on a region where the wiring layer and the lower electrode are to be provided.

Figure 27B:
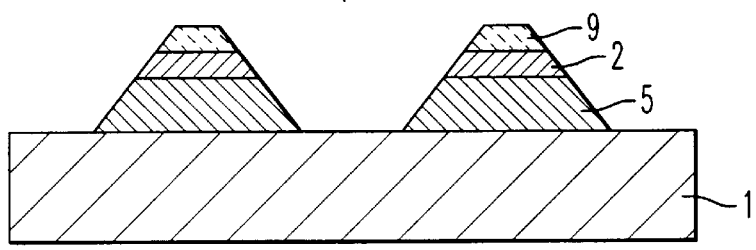

Then as shown in FIG. 27(b), etching is used to remove or etch unnecessary portions of the photoresist and the wiring layer. At that time, the photoresist remains left.

Figure 27C:
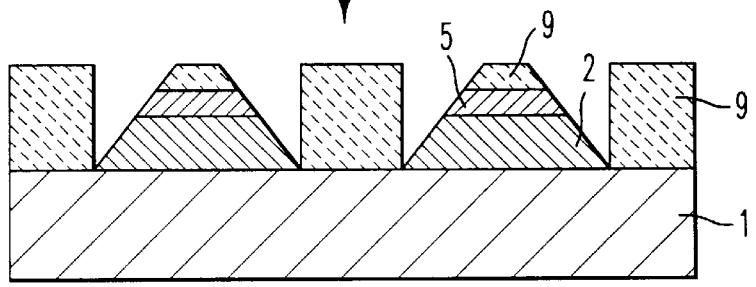

Then as shown in FIG. 27(c), a photoresist 9 is coated on a region where no wiring layer is provided through a reverse side exposure.

Figure 27D:
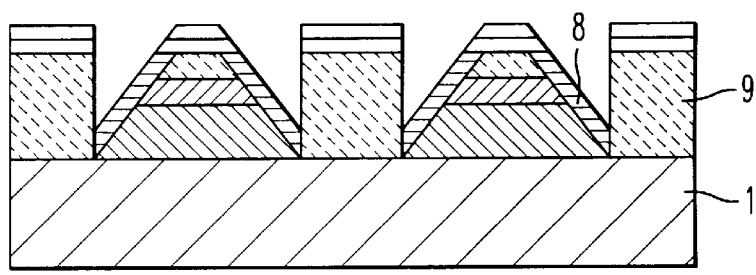

Then as shown in FIG. 27(d), a lateral layer is formed by vapor deposition or sputtering.

Figure 27E:
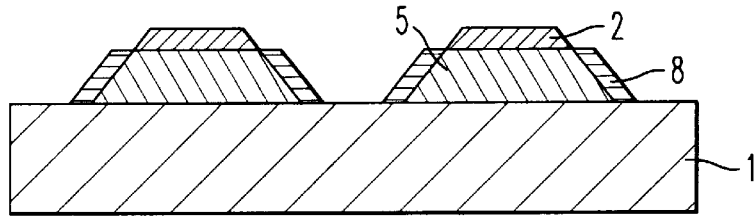

Then as shown in FIG. 27(e), processing is made by lift-off in such a manner that the portions formed by the vapor deposition or the sputtering remain left only on the lateral sides, to thereby obtain a lower portion of the organic EL element of the fifth invention.

(3) Anodizing Method (Part 1)

This method is a process in which the lateral sides of the wiring layer are anodized so that the resultant oxide film is used as a lateral layer.

Figure 28A:
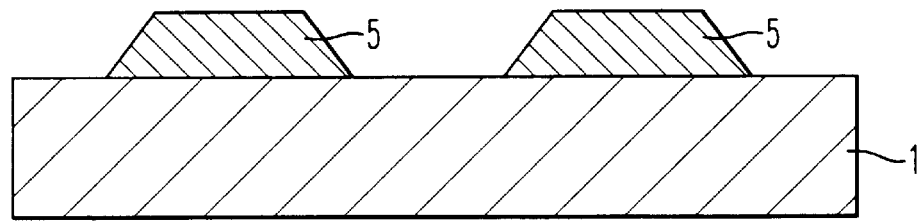
FIGS. 28a–28d are a schematic sectional view diagrammatically showing a further example of the method for forming the lower electrode, wiring layer and planarization layer in the fifth invention.

As shown in FIG. 28(a), a patterned wiring layer 5 is formed on a substate 1. The technique of the above lift-off method (part 1) can be employed as means for forming the wiring layer 5 (see FIGS. 26(a), (b) and (c))

Figure 28B:
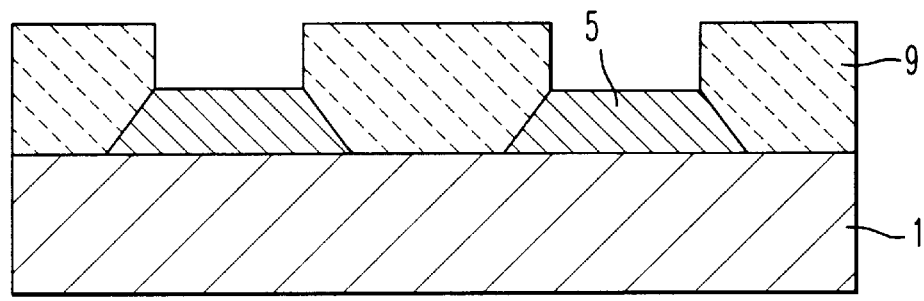

Then as shown in FIG. 28(b), a photoresist 9 is disposed. A difference from the technique of the above lift-off method (part 1) lies in that the photoresist is disposed as far as the lateral sides of the wiring layer 5 at that time.

Figure 28C:
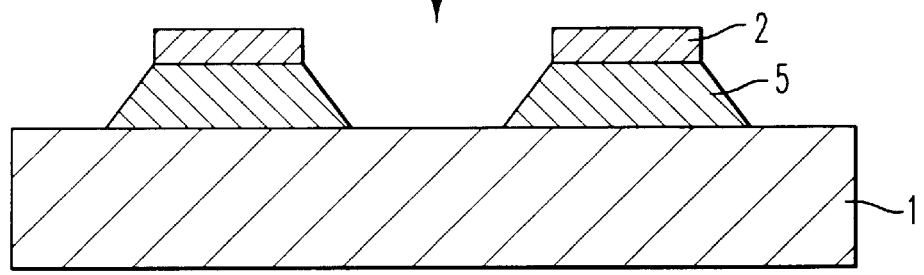

Then as shown in FIG. 28(c), a lower electrode is formed using the same technique as the above lift-off method (part 1).

Figure 28D:
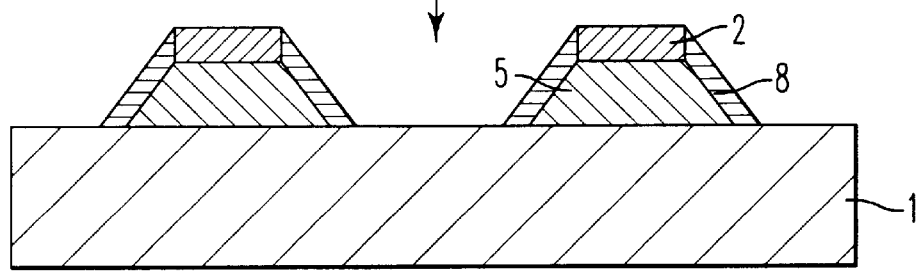

Finally, as shown in FIG. 28(d), the lateral sides of the wiring layer are oxidized by use of anodizing method to form the lateral layer.

(4) Anodizing Method (Part 2)

Figure 29A:
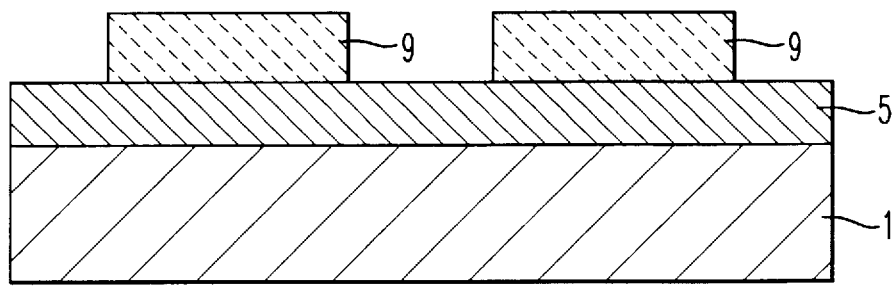
FIGS. 29a–29d are a schematic sectional view diagrammatically showing yet another example of the method for forming the lower electrode, wiring layer and planarization layer in the fifth invention.

A structure shown in FIG. 29(a) is formed using the same technique as the above lift-off method (part 1).

Figure 29B:
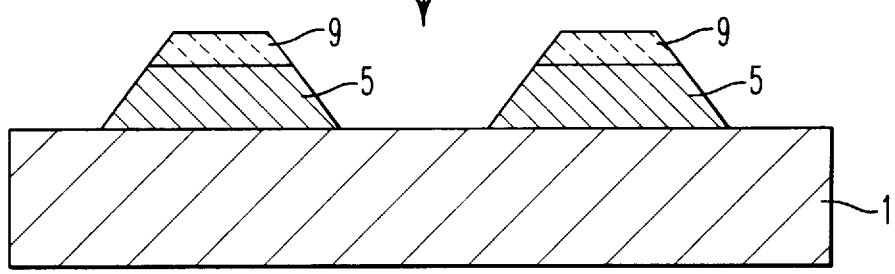

Then as shown in FIG. 29(b), a patterned wiring layer having a tapered section is formed by use of the same technique as the above lift-off method (part 1). It is to be noted that a photoresist layer 9 remains left.

Figure 29C:
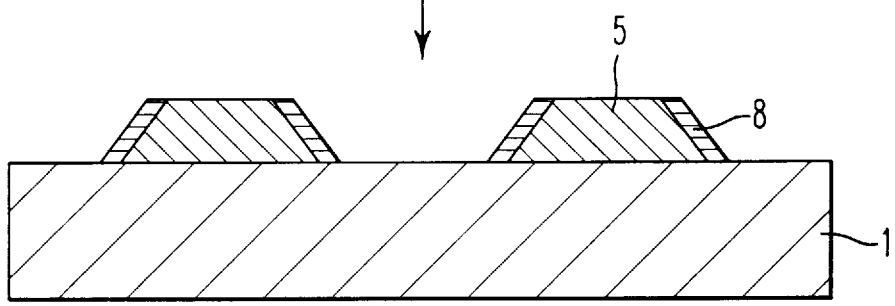

Then as shown in FIG. 29(c), the lateral sides of the wiring layer are oxidized by the anodizing method to form a lateral layer.

Figure 29D:
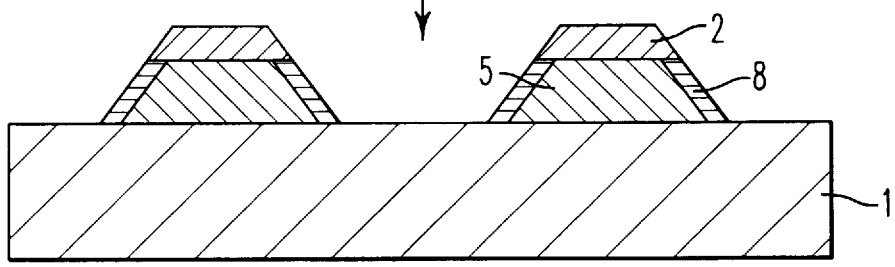

Then regions other than the top of the wiring layer are coated with a photoresist and thereafter a lower electrode is deposited by sputtering or vapor deposition, after which the photoresist is removed to form a lower portion of the organic EL element of the fifth invention as shown in FIG. 29(d).

(5) Anodizing Method (Part 3)

This method is a process in which a wiring layer is first deposited and then a lower electrode is deposited for patterning, after which anodization is effected on regions of the wiring layer which have not been covered with the lower electrode, to form a lateral layer. A patterned, tapered in section deposit plate of the wiring layer and the lower electrode can be formed by using the technique (see FIG.

27(a) and (b)) shown in the above lift-off method (part 2). It is to be noted in this case that the photoresist layer is entirely removed dissimilar to FIG. 27(b). Then the lateral layer is formed by use of the anodizing method. In case of this method, the material of the lower electrode must be a non-oxydizable metal such as Au and Pt for example. This method is particularly preferred since it has a reduced number of steps for the formation of the lower portion of the organic EL element of the fifth invention.

VI. Sixth Invention (Organic EL Display Device Using Organic EL Element Having Tapered Wiring Layer)

A sixth invention relates to an organic EL display device basicallyusing the organic EL element of the fifth invention.

The organic EL display device of the sixth invention comprises a plurality of scanning electrode lines and a plurality of signal electrode lines which intersect the plurality of scanning electrode lines, with the intersection areas being provided with luminous pixels in arrays. Each luminous pixel is formed from an organic EL element comprising a substrate, thereon superposed in the mentioned order a lower electrode, an organic layer including an organic luminescent layer, and a counter electrode.

The scanning electrode lines each include a lower electrode and a wiring layer connected to the underside thereof. A layer formed from the wiring layer and a lateral layer covering the lateral sides of the wiring layer is trapezoidal (tapered) in section, with the wiring layer being isolated from the organic layer by the lower electrode and the lateral layer. A signal electrode line includes the counter electrode.

A luminous pixel for use in the sixth invention is formed from an element having the same configuration as that of the organic EL element of the fifth invention. For this reason, the organic EL element making up the present invention can be fabricated using the same materials as those of the organic El, element set forth in the fifth invention and using the same methods. It is also possible to employ the same configuration as set forth in the fifth invention.

The scanning electrode lines, signal electrode lines and display device of the present invention allow a direct application of the content set forth in the fourth invention, so that it is possible to realize a lowering in resistance of the scanning electrode lines in the same manner as the fourth invention. It is to be noted that the present invention prevents a breakage of the layer superposed on the lower electrode layer by employing a specifically shaped wiring layer instead of the planarization layer.

Hereinafter, the present invention will more specifically be described on the basis of examples thereof.

Reference Example 1
(Preparation of Substrate Used in organic EL Element of First Invention)

A photoresist was spin coated on a 100 mm×100 mm blue plate (soda-lime) glass and was exposed to light so that 10 $\mu$m wide photoresist apertures were patterned at a pitch of 100 $\mu$m. The number of lines at the apertures were 960. Then using a buffer fluoric acid (HF:NH$_4$F:H$_2$O)=5:1:6), etching was effected until 0.5 $\mu$m deep grooves was formed. A 0.5 $\mu$m thick Al film was then formed by sputtering. Then this substrate was immersed in acetone so that materials other than Al deposited in the grooves were removed together with the photoresist. ITO was then deposited to a thickness of 100 nm on this substrate by sputtering. The ITO was etched by photolithography to form an 80 $\mu$m wide ITO line at a pitch of 100 $\mu$m on an Al line serving as the wiring layer implanted in the substrate. It was confirmed that the Al line was positioned so as to be on top of an edge of the ITO line with the excellent electrical connection between the ITO line and the Al line. As a result of measurement, the resistance value of one of the electrode lines proved to be as sufficiently low as 800 Ω for 10 cm.

Reference Example 2
(Preparation of Organic Electroluminescence Element)

Amine oligomer (TPD74 shown below) was coated to a thickness of 80 nm on the substrate prepared in the reference example 1 by a vacuum deposition method, on top of which TPD shown below was additionally coated to a thickness of 20 nm. Herein, TPD74 and TPD function respectively as a hole injection layer and a hole transport layer. Tris(8-hydroxyquinoline) Al complex (Alq) which is a green luminous material was then vacuum deposited to a thickness of 60 nm thereon. An Al:Li (Li concentration of 0.5 atm %) alloy cathode was then formed to a thickness of 200 nm. All these depositions were continuously carried out without exposing a vacuum vessel to air. It is to be noted that previous to the formation of the Al:Li alloy cathode, masking was made using a deposition mask provided with aperture lines orthogonal to the ITO line. The number of aperture lines of the mask was 240 with the line width of 200 $\mu$m. It is therefore possible to fabricate a 240×(320×3) XY matrix display.

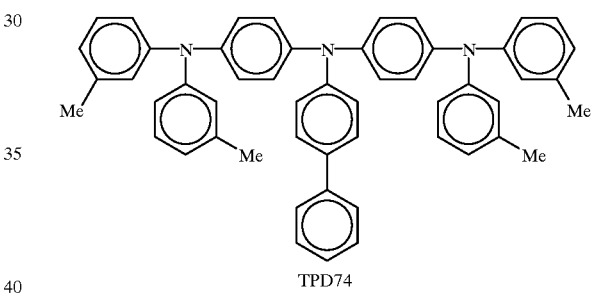

TPD74

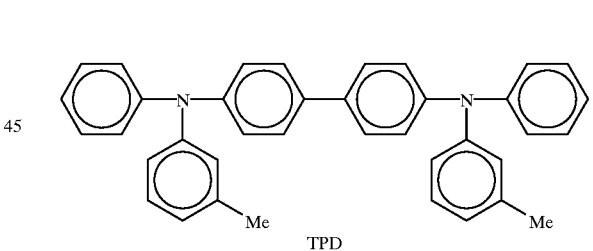

TPD

Reference Example 3
(Evaluation of Element Using Lower Electrode of First Invention as Signal Line)

The display fabricated in the reference example 2 was sealed by a glass cover. The bottom substrate and the glass cover were joined together by means of an ultraviolet curing resin, and a fluorinated hydrocarbon liquid was injected into the interior of the glass cover. Then connection to a drive circuit was made to perform a display (at a duty of 1/120) with the cathode as the scanning electrode and with the anode (ITO) as the signal electrode. As a result of this there was found no cross talk. Any line defect due to a cathode breakage was not found either. Furthermore, it was also possible to perform an image display without any delay in the display response speed attributable to the resistance.

Comparative Example 1
(Evaluation of Conventional Element)

ITO lines having the same pitch and width as the reference example 1 (the surface resistance value of ITO is 20 Ω/□) were formedona 100 mm×100 mm glass substrate. The resistance value of one of the ITO lines was measured in the same manner as the reference example 1. The measured resistance was as extremely high as 25 kΩ. A display was fabricated in the same manner as the reference example 2. Sealing was made with the connection to the drive circuit in the same manner as the reference example 3.

Since the ITO lines have a high resistance, a group of pixels corresponding to an intermediate ITO line were activated. As a result of this, a significant inuniformity in the luminance was observed and a uniform luminance could not be obtained. Accordingly, it was difficult to perform a satisfactory display of characters and images due to the inuniformity in the luminance.

Example 4
(Organic EL Element of First Invention)

Al:Ti alloy (Ti: 3 atm %) film was formed by sputtering to a thickness of 0.3 μm on a 100 mm×100 mm glass substrate. A photoresist was spin coated on this film for the exposure to light so that 960 line apertures with a width of 20 μm and a pitch of 100 μm were patterned. The Al alloy film was then oxidized through the supply of current by anodizing method. About 0.01 wt. % of citric acid aqueous solution was used as an electrolyte. Through this process, a multiplicity of wiring layer lines insulated from one another were formed with the planarization layer in the form of an Al oxide film. 80 μm wide ITO lines were then formed at a pitch of 100 μm in the same manner as the reference example 2. Measurement of the resistance of one of the lines resulted in 400 Ω for 1 cm in length. A display was then fabricated and sealed in the same manner as the reference examples 2 and 3. This display was driven in the same manner as the reference example 3, with the result that excellent images free from any line defects were displayed.

Comparative Example 2
(Example of Conventional Element

ITO lines which number is 960 and width is 80 μm were formed at a pitch of 100 μm on a 100 mm×100 mm glass substrate. An Al film was then formed to a thickness of 0.5 μ on the ITO lines by sputtering. This was etched so that 10 μm wide Al wiring layer lines were formed on the ITO lines. These Al wiring layer lines were not covered with an interlayer insulating film.

Comparative Example 3
(Example of Conventional

The section of the Al wiring layer was observed by means of a scanning electron microscope. Sharp steps were provided with a taper angle of 75°. This Al layer was then anodized to obtain a 0.2 μm thick oxide film. An electrolyte solution used was a 1:9 in volume ratio mixture of 0.1 mol/1 ammonium tartrate and ethylene glycol. A voltage used was 240 V.

Comparative Example 4
(Evaluation of Conventional Element)

The substrates of the comparative examples 2 and 3 were used to separately fabricate displays in the same manner as the reference example 2. Use of the substrate of the comparative example 2 resulted in frequent occurrence of short circuit between the cathode and anode with frequent cross talk in display. Frequent occurrence of cathode breakage was also found with a multiplicity of display defects, resulting in a poor image display. This is because of a breakage in the cathode caused by the steps of the Al wiring layer. Use of the substrate of the comparative example 3 resulted in no short circuit between the anode and cathode by virtue of the effect of the interlayer insulating film. However, the interlayer insulating film is not flattened, so that a breakage in the cathode occurred, resulting in display defects.

Example 5
(Organic EL Element of Second Invention

Etching was made in the same manner as the comparative example 2 so that 960 Al lines each having a width of 10 μm were formed on 80 μm wide ITO lines. An etching solution was a 5:15:20:3 mixture of HF: $HNO_3$: $CH_3COOH$: $H_2O$. Al steps were tapered. The taper angle was as extremely gentle as 20°. Tapering may be carried out by dry etching method using $CCl_4$ plasma gas. Then by use of 0.2 mol/1 ammonium borate solution, anodizing was performed with the Al lines serving as the anode, to form 0.2 μm thick anodized film. At that time, the voltage was 250 V. As a result of this, a flattened interlayer insulating film was formed on the Al wiring layer lines. The step taper angle was 21° with smoothness and flatness to a large extent. A display was fabricated in the same manner as the reference example 2 and then driven similarly to the reference example 3 to perform an image display. No breakage in the cathode and no line display defect was observed. Upon a display of pixels, any delay in the display response speed due to electrode resistance was not found and the display itself was excellent.

Example 6
(Element of Second Invention (Double XY Matrix))

A multiplicity of ITO dot patterns were formed in a pattern form shown in FIG. 14 on a 100 mm×100 mm glass plate. Then wiring lines of the wiring layer having the pattern of FIG. 14 were formed from Al film. The resultant 0.5 μm thick, 10 μm wide wiring lines were tapered in the same manner as the example 5 and then covered with an interlayer insulating film. The interlayer insulting film had already been flattened. Then a display was fabricated and sealed in the same manner as the reference example 2. Due to the double XY matrix shown in FIG. 14, the drive duty for 240 scanning electrodes was enabled to reduce from 1/240 to 1/120 with excellent display free from any cross talk. The reduction in the duty brought about a reduction by 22% in the drive voltage, resulting in 22% reduction in the power consumption.

Example 7
(Element of Second Invention (Quadruple XY Matrix))

An element making up the quadruple matrix shown in FIG. 15 was fabricated in the same manner as the example 6. The duty was enabled to reduce from 1/240 to 1/60, so that the drive voltage was reduced by 35%, resulting in 35% reduction in the power consumption.

Example 8
(Fabrication by Anodizing Method of Substrate Carrying Thereon Lower Electrode Constituting Organic EL Element of Third Invention)

A 400 μm thick Al—Ti alloy (Ti content=3 atm %) film was formed by sputtering on a 100 mm×100 mm glass substrate.

Then a photoresist was spin coated on this film and thereafter exposed to light so that 240 lines having a width of 20 μm and a pitch of 220 μm were formed.

Then 0.01 wt % citric acid solution was used as an electrolyte and the Al—Ti alloy was supplied with a current by anodizing method. As a result of this process, a multiplicity of Al—Ti alloy lines (200 µm wide wiring layer) were formed in a manner insulated from one another between Al oxide films serving as planarization layers.

Then the photoresist was peeled away for removal and an In—Zn—O oxide electrode (lower electrode) was formed by sputtering on the Al—Ti alloy lines (wiring layer). The sputtering was carried out at a sputtering output of 2W/cm$^2$ in an atmosphere of argon: oxygen=1000:2.8 (volume ratio) with the degree of vacuum of 0.2 Pa.

Then a predetermined number of lines were patterned so as to cover the wiring layer, to obtain lower electrode lines.

Afterward, any ten of the lower electrodes formed in the deposit plate prepared were selected to measure the resistance value for unit length. The results are shown in Table 3.

Example 9
(Fabrication by Anodizing Method of Substrate Carrying Thereon Lower Electrode Constituting Organic EL Element of Fifth Invention)

A 400 nm thick Al—Ti alloy (Ti content=3 atm %) film was formed by sputtering on a 100 mm×100 mm glass substrate, on which a 10 nm thick platinum thin film was formed by sputtering.

Then the photoresist was spin coated and exposed to light, to form a multiplicity of 20 µm wide, 220 µm pitch lines.

Then RIE (reactive ion etching) was made in the condition that a flow rate ratio of CF$_4$ and oxygen is 575:625 sccm at a pressure of 40 Pa and the substrate temperature of 90° C. It was previously confirmed that the etching in this condition ensured tapering of 30°. This process enabled the Al—Ti alloy to have a trapezoidal section and serve as the wiring layer. The platinum on the other hand served as the lower electrode.

Then the lateral side of this wiring layer was anodized into a lateral layer made of Al$_2$O$_3$. First, a pH 7.0 electrolyte solution was prepared by adding an ammonium aqueous solution to a 1:9 (volume ratio) mixed solution of ammonium tartrate and ethylene glycol.

Then the substrate having the wiring layer and lower electrode deposited thereon was immersed in this electrolyte solution, and anodization was performed at an applied voltage of 240 V with the wiring layer acting as the anode and with the cathode in the form of a platinum mesh electrode provided in an electrolyte solution vessel. This allowed the lateral sides of the oxidized layer not covered with the lower electrode to be anodized, to form a 200 nm thick Al$_2$O$_3$ layer.

Afterward, the resistance value was measured in the same manner as the example 8. The results are shown in Table 3.

Example 10
(Fabrication by Polymer Flattening Method of Substrate Carrying Thereon Lower Electrode Constituting Organic EL Element of Third Invention)

A 2 µm thick Al—Ti alloy (Ti content=3 atm %) film was formed by sputtering on a 100 mm×100 mm glass substrate, on which a photoresist was spin coated and exposed to light, to form 240 apertures 20 µm wide at a pitch of 220 µm in a juxtaposed manner.

RIE (reactive ion etching) was then carried out with CF$_4$ as a gas species piece to form the apertures. The photoresist was then peeled away for removal and thereafter a commercially available polyimide coating solution having a photosensitive function was coated to a thickness of 4 µm for flattening. Afterward, through the exposure to light, curing was made to form the contact holes.

An In—Zn—O oxide electrode (lower electrode) was then formed by sputtering to a thickness of 100 nm on the Al—Ti alloy lines (wiring layer). The sputtering was carried out at a sputtering output of 2 W/cm$^2$ in an atmosphere of argon: oxygen=1000:2.8 (volume ratio) with the degree of vacuum of 0.2 Pa. At that time, the lower electrode was formed in such a manner as to be in contact with the wiring layer at the contact holes. Afterward, it was fashioned into 20 µm wide, 220 µm pitch lines.

The resistance value was then measured in the same manner as the example 8. The results are shown in Table 3.

Comparative Example 5
(Example of Conventional Element)

A 200 nm thick In—Zn—O film was formed by sputtering on a 100 mm×100 mm glass substrate. The sputtering was carried out at a sputtering output of 2W/cm$^2$ in an atmosphere of argon: oxygen=1000:2.8 (volume ratio) with the degree of vacuum of 0.2 Pa. The surface resistance value of the thus formed In—Zn—O film was 15 Ω/□. This thin film was processed by photolithography so that 200 µm wide, 220 µm pitch In—Zn—O film lines were formed.

Afterward, the resistance value was measured in the same manner as the example 8. The results are shown in Table 3.

Comparative Example 6
(Evaluation of Resistance of Lower Electrode Connected to Thin Wire Wiring Layer)

A laminate consisting of the substrate, wiring layer and lower electrode was prepared using the same method as the example 8. At that time, the width of the wiring layer was 20 µm and the width of the lower electrode was 1/10.

Subsequently, the resistance value was measured in the same manner as shown in the example 8. The results are shown in Table 3.

TABLE 3

|  | Resistance for Unit Length (Ω) | Resistance for 9 cm in Length (Ω) |
| --- | --- | --- |
| Example 8 | 6 | 54 |
| Example 9 | 5 | 45 |
| Example 10 | 1.5 | 13.5 |
| Comparative Example 5 | 600 | 7200 |
| Comparative Example 6 | 100 | 900 |

It was confirmed from Table 3 that the lower electrode of the deposit plate constituting the organic EL element of the present invention has an extremely low resistance value and hence is usable as the scanning lines in the large size screen, high definition organic EL display device.

Example 11
(Fabrication of Organic EL Element of Third Invention)

The deposit plate prepared in the example 8 was cleansed with isopropyl alcohol and further cleansed for 5 minutes using both ultraviolet and ozone.

TPD74 having a structure shown below was then coated to a thickness of 80 nm as a hole injection layer by use of vacuum deposition method.

NPD having a structure shown below was then coated to a thickness of 20 nm as a second hole injection layer by using the vacuum deposition method.

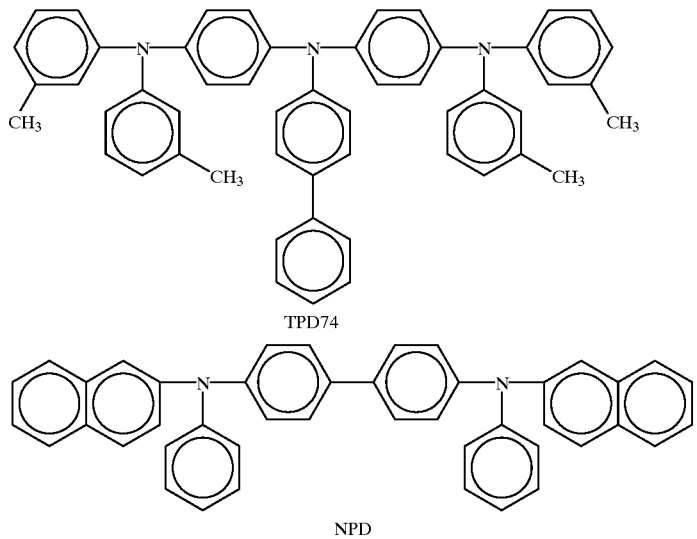

TPD74

NPD

Tris(8-hydroxyquinoline) Al complex which is a green luminous material was then vacuum deposited to a thickness of 60 nm. Mg-Ag alloy was vacuum deposited to a thickness of 10 nm thereon to form an electron injection electrode layer. Upon the Mg-Ag alloy vacuum deposition, Mg and Ag were deposited at a deposition rate of 14:1 so that the alloy was formed on the deposition surface.

Afterward, without opening a vacuum vessel in which the vacuum deposition was carried out, the deposit plate was transferred to a sputtering vessel in which a 200 nm thick In—Zn—O film was formed by DC sputtering method to obtain an amorphous transparent conductive film. The condition at that time was such that the atmosphere was argon: oxygen=1000:2.8 (volume ratio) with the degree of vacuum of 0.2 Pa and that the sputtering output was $0.5W/cm^2$.

Upon the formation of the electron injection electrode layer and the amorphous transparent conductive film, the deposition mask made of a polyimide film (having 240 lines and 200 $\mu$m width at 300 $\mu$m pitch) was used.

Then the organic EL element fabricated in accordance with the above processes was sealed by a glass cover. The sealing was carried out in nitrogen atmosphere, with the substrate being joined to the glass cover using an ultraviolet curing resin.

Then, by using as the scanning line the wiring layer connected to the lower electrode and using as the signal line the counter electrode composed of the electron injection electrode layer and the amorphous transparent conductive film, a pixel display was carried out at a duty of 1/120. As a result of this, the organic EL element presented a luminous efficiency of 3.2 cd/A with no cross talk. An excellent pixel display free from any line defect arising from a breakage in the signal line was achieved.

Example 12
(Fabrication of Organic EL Element of Fifth Invention or Organic EL Display Device of Sixth Invention)

By using the deposit plate prepared in accordance with the processes of the example 9 and using the organic EL display device fabricated in accordance with the same processes as the example 11, the fabrication of the display was carried out. As a result of this, an excellent pixel display free from any cross talk and from line defects caused by a breakage in the signal line was obtained.

Example 13
(Fabrication of Organic EL Element of Third Invention or Organic EL Display Device of Fourth Invention)

By using the deposit plate prepared in accordance with the processes of the example 10 and using the organic EL display device fabricated in accordance with the same processes as the example 11, the fabrication of the display was carried out. As a result of this, an excellent pixel display with no cross talk and with no line defect attributable to a breakage in the signal line was obtained.

Comparative Example 7

By using the deposit plate prepared in accordance with the processes of the comparative example 5 and using the organic EL display device fabricated in accordance with the same processes as the example 11, the fabrication of the display was carried out. The result was such that the scanning line presented a high resistance value with no uniform luminescence, making it difficult to provide a display.

Comparative Example 8

By using the deposit plate prepared in accordance with the processes of the comparative example 6 and using the organic EL display device fabricated in accordance with the same processes as the example 11, the fabrication of the display was carried out. The result was such that 82V appeared upon the full activation at a luminance of 100 $cd/m^2$, proving a boost of voltage upon the drive. At that time, a constant current drive was used to allow a boost of the applied voltage. It is to be noted that the display device of the comparative example 8 allows the luminescence to be emitted from the bottom and top of the substrate. For this reason, the luminance is corrected in view of this respect.

INDUSTRIAL APPLICABILITY

As described hereinabove, the organic electroluminescence element and the organic electroluminescence display device of the present invention are applicable advantageously to various displays principally for information industry equipment. In particular, they are applicable particularly advantageously to high definition and large size displays due to their ability to prevent any delay in response upon the drive which may arise from a voltage drop or voltage resistance attributable to the wiring.

What is claimed is:

1. An organic electroluminescence element comprising a substrate and thereon superposed in the mentioned order a lower electrode, an organic layer including an organic luminescent layer, and an counter electrode;

said lower electrode having a specific resistance which is equal to or more than $0.5 \times 10^{-4}$ $\Omega \cdot cm$, said lower electrode connecting to a wiring layer for reducing the resistance value, said wiring layer being implanted in a planarization layer interposed between said substrate and said lower electrode.

2. The organic electroluminescence element according to claim 1, wherein said wiring layer is implanted in said planarization layer interposed between said substrate and said lower electrode and is covered with said lower electrode.

3. An organic electroluminescence element comprising a substrate and thereon superposed in the mentioned order a lower electrode, an organic layer including an organic luminescent layer, and an counter electrode;

said lower electrode having a specific resistance which is equal to or more than $0.5 \times 10^{-4}$ $\Omega \cdot cm$, said lower electrode connecting to a wiring layer for reducing the resistance value, said wiring layer being covered with a flattened interlayer insulating film interposed between said wiring layer and said organic layer including an organic luminescent layer.

4. The organic electroluminescence element according to any one of preceding claims, wherein said lower electrode is a transparent electrode.

5. The organic electroluminescence element according to any one of claims 1 to 3, wherein said planarization layer or said interlayer insulating film is an oxide film obtained by oxidizing the surface of a metal film forming said wiring layer.

6. The organic electroluminescence element according to claim 3, wherein said interlayer insulating film has a trapezoidal (tapered) section.

7. The organic electroluminescence element according to any one of claims 1 to 3, wherein said lower electrode and said counter electrode form an XY matrix.

8. The organic electroluminescence element according to any one of claims 1 to 3, wherein said wiring layer reduces the resistance value of an electrode line to 5 k$\Omega$ or below.

9. The organic electroluminescence element according to claim 7, wherein said XY matrix formed from said lower electrode and said counter electrode is a double, triple or quadruple matrix.

10. An organic electroluminescence element comprising a substrate and thereon superposed in the mentioned order a lower electrode, an organic layer including an organic luminescent layer, and an counter electrode;

said lower electrode being connected to a wiring layer, said wiring layer having a width which is equal to 15 to 150% of the width (the length of short side) of said lower electrode, said wiring layer being implanted in a planarization layer interposed between said substrate and said lower electrode.

11. The organic electroluminescence element according to claim 10, wherein said lower electrode and said counter electrode form an XY matrix.

12. The organic electroluminescence element according to claims 10 or 11, wherein said wiring layer has a resistance value for unit length (1 cm) which is equal to or less than 100 $\Omega$.

13. An organic electroluminescence display device comprising a plurality of scanning electrode lines and a plurality of signal electrode lines intersecting said plurality of scanning electrode lines, with their intersections being provided with luminous pixels in arrays;

said luminous pixels being organic electroluminescence elements each comprising a substrate and thereon superposed in the mentioned order a lower electrode, an organic layer including an organic luminescent layer, and an counter electrode, said scanning electrode lines each comprising said lower electrode and a wiring layer connected thereto, said wiring layer being implanted in a planarization layer interposed between said substrate and said lower electrode, said signal electrode lines each including said counter electrode.

14. The organic electroluminescence display device according to claim 13, wherein said wiring layer has a width (length of the short side) which is equal to 15 to 150% of the width (length of the short side) of said lower electrode.

15. The organic electroluminescence display device according to claims 13 or 14, wherein said wiring layer has a resistance value for unit length (1 cm) which is equal to or less than 100 $\Omega$.

16. An organic electroluminescence element comprising a substrate and thereon superposed in the mentioned order a lower electrode, an organic layer including an organic luminescent layer, and an counter layer; said element comprising a wiring layer connected to the bottom of said lower electrode, with a layer formed from a lateral layer covering the side of said wiring layer and from said wiring layer being trapezoidal (tapered) in section, said wiring layer being isolated by said lower electrode and said lateral layer from said organic layer.

17. The organic electroluminescence element according to claim 16, wherein said lower electrode and said counter electrode form an XY matrix.

18. The organic electroluminescence element according to claims 16 or 17, wherein said lateral layer is made of a material selected from a group consisting of the same material as that of said lower electrode layer, an insulating material, and a material allowing the amount of the injection of electric charges into said organic layer which is equal to or less than 1/50 of that of said lower electrode.

19. An organic electroluminescence display device comprising a plurality of scanning electrode lines and a plurality of signal electrode lines intersecting said plurality of scanning electrode lines, with their intersections being provided with luminous pixels in arrays;

said luminous pixels being organic electroluminescence elements each comprising a substrate and thereon superposed in the mentioned order a lower electrode, an organic layer including an organic luminescent layer, and an counter electrode, said scanning electrode lines each comprising said lower electrode and a wiring layer connected to the bottom of said lower electrode, with a layer formed from a lateral layer covering the side of said wiring layer and from said wiring layer being trapezoidal (tapered) in section, said wiring layer being isolated from said organic layer by said lower electrode and said lateral layer covering the side of said wiring layer, said signal electrode lines each including said counter electrode.

20. The organic electroluminescence display device according to claim 19, wherein said lateral layer is made of a material selected from a group consisting of the same material as that of said lower electrode layer, an insulating material, and a material allowing the amount of the injection of electric charges into said organic layer which is equal to or less than $1/50$ of that of said lower electrode.

* * * * *